United States Patent
Kwon et al.

(10) Patent No.: US 12,466,767 B2
(45) Date of Patent: Nov. 11, 2025

(54) DISPLAY DEVICE WITH FUSION REGION OVERLAPPING METAL WIRING

(71) Applicant: Samsung Display Co., LTD., Yongin-si (KR)

(72) Inventors: Yong Hoon Kwon, Suwon-si (KR); Hyun Ji Lee, Gimhae-si (KR); Jung Hyun Kim, Suwon-si (KR); Tae Oh Kim, Hwaseong-si (KR); So Mi Jung, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/378,596

(22) Filed: Oct. 10, 2023

(65) Prior Publication Data
US 2024/0040822 A1 Feb. 1, 2024

Related U.S. Application Data

(62) Division of application No. 17/107,705, filed on Nov. 30, 2020, now Pat. No. 11,812,629.

(30) Foreign Application Priority Data

Jan. 14, 2020 (KR) .......................... 10-2020-0004806

(51) Int. Cl.
C03C 27/04 (2006.01)
H10K 50/842 (2023.01)
(Continued)

(52) U.S. Cl.
CPC ....... *C03C 27/044* (2013.01); *H10K 50/8426* (2023.02); *H10K 59/8722* (2023.02);
(Continued)

(58) Field of Classification Search
CPC ............ H10K 50/8426; H10K 59/131; H10K 59/8722; H10K 71/00; H10K 71/10; C03C 27/044
See application file for complete search history.

(56) References Cited

U.S. PATENT DOCUMENTS 8,884,849 B2    11/2014  Masuda
9,216,557 B2    12/2015  Yamazaki et al.
(Continued)

FOREIGN PATENT DOCUMENTS

CN    103137895 A    6/2013
CN    104701352 A    6/2015
(Continued)

OTHER PUBLICATIONS

Office Action issued Feb. 15, 2024 in corresponding KR Application No. 10-2020-0004806, 13 pages.
(Continued)

*Primary Examiner* — Lex H Malsawma
(74) *Attorney, Agent, or Firm* — CANTOR COLBURN LLP

(57) ABSTRACT

A display device includes a display panel including a display area and a non-display area surrounding the display area, and a metal wiring layer disposed on at least a portion of the non-display area, an encapsulation substrate disposed on the display panel, a sealing member which is disposed between the display panel and the encapsulation substrate and bonds the display panel to the encapsulation substrate and a first fusion region provided in at least a partial region between the sealing member and the encapsulation substrate, where the first fusion region has no physical boundary, and where at least a portion of the sealing member is disposed on the metal wiring layer in the non-display area, and the first
(Continued)

fusion region is separated from the metal wiring layer while overlapping the metal wiring layer in a thickness direction.

14 Claims, 27 Drawing Sheets

(51) Int. Cl.
*H10K 59/80* (2023.01)
*H10K 71/00* (2023.01)
*H10K 59/131* (2023.01)
*H10K 77/10* (2023.01)

(52) U.S. Cl.
CPC .......... *H10K 71/00* (2023.02); *H10K 59/131* (2023.02); *H10K 77/10* (2023.02)

(56) References Cited

U.S. PATENT DOCUMENTS

| | | | |
|---|---|---|---|
| 9,825,112 | B2 | 11/2017 | Zou |
| 10,361,392 | B2 | 7/2019 | Yamazaki et al. |
| 11,011,728 | B2 | 5/2021 | Kwon et al. |
| 11,101,444 | B2 | 8/2021 | Yamazaki et al. |
| 11,552,152 | B2 | 1/2023 | Shim et al. |
| 2012/0313128 | A1 | 12/2012 | Yokoyama et al. |
| 2013/0126938 | A1* | 5/2013 | Eberhardt ............... B23K 26/57 438/26 |
| 2013/0134398 | A1* | 5/2013 | Yamazaki ............... B32B 17/10 257/40 |
| 2016/0111677 | A1 | 4/2016 | Hong et al. |
| 2016/0218317 | A1 | 7/2016 | Hong et al. |
| 2018/0337364 | A1 | 11/2018 | Kwon et al. |
| 2019/0047251 | A1 | 2/2019 | Song et al. |
| 2019/0131360 | A1* | 5/2019 | Lee ........................ H10K 59/131 |
| 2021/0384462 | A1 | 12/2021 | Yamazaki et al. |

FOREIGN PATENT DOCUMENTS

| | | |
|---|---|---|
| CN | 108962941 A | 12/2018 |
| CN | 110070798 A | 7/2019 |
| JP | 2013062027 A | 4/2013 |
| JP | 2013535393 A | 9/2013 |
| JP | 2015013760 | 1/2015 |
| KR | 100714000 B1 | 5/2007 |
| KR | 100887368 | 3/2009 |
| KR | 101374015 | 3/2014 |
| KR | 1020180127605 A | 11/2018 |
| KR | 1020190018577 A | 2/2019 |
| KR | 1020190055860 | 5/2019 |
| WO | 2012011268 A1 | 1/2012 |

OTHER PUBLICATIONS

Extended European Search Report—European Application No. 21151473.2 dated Jun. 9, 2021, citing references listed within.

\* cited by examiner

DISPLAY DEVICE WITH FUSION REGION OVERLAPPING METAL WIRING

This application is a divisional of U.S. patent application Ser. No. 17/107,705, filed on Nov. 30, 2020, which claims priority to Korean Patent Application No. 10-2020-0004806, filed on Jan. 14, 2020, and all the benefits accruing therefrom under 35 U.S.C. § 119, the content of which in its entirety is herein incorporated by reference.

BACKGROUND

1. Field

Embodiments of the invention relate to a display device and a method of fabricating the same.

2. Description of the Related Art

An importance of display devices has steadily increased with a development of multimedia technology. Accordingly, various types of display devices such as an organic light emitting display, a liquid crystal display ("LCD") and the like have been used.

A display device displays an image, and includes a display panel, such as an organic light emitting display panel or an LCD panel. Among display panels, a light emitting display panel may include a light emitting element. Examples of a light emitting diode ("LED") include an organic light emitting diode ("OLED") using an organic material as a fluorescent material, and an inorganic LED using an inorganic material as a fluorescent material.

SUMMARY

Embodiments of the invention provide a display device capable of improving a bonding force of a sealing member for bonding a display panel and an encapsulation substrate to each other, and a method of fabricating the same.

However, the invention is not restricted to the one set forth herein. The above and other features of the invention will become more apparent to one of ordinary skill in the art to which the invention pertains by referencing the detailed description of the invention given below.

A display device in an embodiment includes a sealing member disposed between a display panel and an encapsulation substrate, and a fusion region provided at least between the sealing member and the encapsulation substrate and having no physical boundary. The sealing member is disposed to partially overlap a metal wiring layer provided in a non-display area of a display panel, and the fusion region is separated from the metal wiring layer while overlapping the metal wiring layer in a thickness direction. The sealing member is in direct contact with the display panel and the encapsulation substrate to bond them to each other, and at the same time, a fusion region further improves a bonding force with the encapsulation substrate.

Since the display device in the embodiment includes the fusion region provided by fusing materials of the sealing member and the encapsulation substrate or the display panel at a boundary between the sealing member and the encapsulation substrate or the display panel, durability of the display device against external impact may be improved.

The effects of the invention are not limited to the aforementioned effects, and various other effects are included in the specification.

An embodiment of the invention provides a display device including a display panel including a display area and a non-display area surrounding the display area, and a metal wiring layer disposed on at least a portion of the non-display area, an encapsulation substrate disposed on the display panel, a sealing member which is disposed between the display panel and the encapsulation substrate and bonds the display panel to the encapsulation substrate and a first fusion region provided in at least a partial region between the sealing member and the encapsulation substrate, where the first fusion region has no physical boundary, and where at least a portion of the sealing member is disposed on the metal wiring layer in the non-display area, and the first fusion region is separated from the metal wiring layer while overlapping the metal wiring layer in a thickness direction.

In an embodiment, the first fusion region may be provided by mixing a material of the sealing member with a material of the encapsulation substrate.

In an embodiment, a height of the first fusion region may be greater than a thickness of the sealing member.

In an embodiment, the first fusion region may include a first portion overlapping the sealing member and a second portion overlapping the encapsulation substrate, and where a maximum value of a width of the first portion may be greater than a maximum value of a width of the second portion.

In an embodiment, the sealing member may form a first boundary surface where at least a portion of a lower surface of the sealing member is in direct contact with the metal wiring layer, and the first boundary surface may have a physical boundary with the metal wiring layer.

In an embodiment, the sealing member may form a second boundary surface where at least a portion of an upper surface of the sealing member is in direct contact with the encapsulation substrate, and the second boundary surface may have a physical boundary with the encapsulation substrate, and where a physical boundary may do not exist in a portion where the first fusion region is provided on an extension line of the second boundary surface.

In an embodiment, the first fusion region may include a third boundary surface between the first portion and the sealing member and a fourth boundary surface between the second portion and the encapsulation substrate.

In an embodiment, a thickness of the sealing member may range from about 4.5 micrometers (μm) to about 6 μm, and a height of the first portion may range from about 2 μm to about 4 μm.

In an embodiment, a plurality of first fusion region is provided between the sealing member and the encapsulation substrate, and a width of the first fusion region may be smaller than an interval between the plurality of first fusion regions.

In an embodiment, a maximum value of the width of the first fusion region may range from about 8 μm to about 12 μm, and a maximum value of a height of the first fusion region may range from about 8 μm to about 12 μm.

In an embodiment, the interval between the plurality of first fusion regions may range from about 50 μm to about 100 μm.

In an embodiment, the display panel may further include an insulating layer disposed under the metal wiring layer, and where at least a portion of a lower surface of the sealing member may be in direct contact with the insulating layer.

In an embodiment, the display device may further include a second fusion region provided between the sealing member and the insulating layer of the display panel, and the second fusion region may have no physical boundary, where the second fusion region may be separated from the encapsulation substrate.

In an embodiment, the second fusion region may include a third portion overlapping the sealing member and a fourth portion overlapping the display panel, and where a maximum value of a width of the third portion may be greater than a maximum value of a width of the fourth portion.

In an embodiment, the sealing member may be in direct contact with the insulating layer of the display panel and includes a fifth boundary surface where a physical boundary exists, and where a physical boundary may do not exist in a portion where the second fusion region is provided on an extension line of the fifth boundary surface.

Another embodiment of the invention provides a display device including a first substrate including a plurality of light emitting elements, the first substrate including a display area in which the plurality of light emitting elements is disposed and a non-display area surrounding the display area, a second substrate disposed on the first substrate, a metal wiring layer disposed in the non-display area of the first substrate, a sealing member which is disposed between the first substrate and the second substrate, overlaps the metal wiring layer and surrounds the display area in the non-display area and a fusion region provided between the second substrate and the sealing member, the sealing member including a first extension portion extending in a first direction along the non-display area, a second extension portion extending in a second direction intersecting the first direction, and a first corner portion connected to the first extension portion and the second extension portion, the first corner portion having a curvature, where the fusion region has no physical boundary, and where the fusion region is provided at least in the first corner portion of the sealing member.

In an embodiment, the fusion region may be also disposed in the first extension portion and the second extension portion of the sealing member, and where a plurality of fusion regions may be spaced apart from each other in the first direction and the second direction.

In an embodiment, the fusion region may form a closed curve and surround the display area along the sealing member.

In an embodiment, a trench portion in which at least one of side surface is recessed inward may be defined in the first substrate and the second substrate, and where the sealing member may be disposed along an outer surface of the trench portion, and the fusion region is provided in the sealing member disposed corresponding to the outer surface of the trench portion.

An embodiment of the invention provides a method of fabricating a display device, the method including preparing a first substrate including a display area and a non-display area and a second substrate facing the first substrate, bonding the first substrate to the second substrate via a sealing member and irradiating an intense light to the sealing member to form a fusion region having no physical boundary between the second substrate and the sealing member.

In an embodiment, a focal point of the intense light may be set to be separated from an upper surface of the second substrate, and a separation distance between the focal point of the intense light and the upper surface of the second substrate may range from about 0.1 urn to about 200 μm.

In an embodiment, the intense light may be irradiated at a frequency of about 1 kilohertz (kHz) to about 10 MHz for about 10 femtoseconds (fs) to about 50 picoseconds (ps).

In an embodiment, the fusion region may be disposed over the sealing member and the second substrate and separated from the first substrate.

In an embodiment, the bonding the first substrate to the second substrate may include filling frit crystals between the first substrate and the second substrate, and sintering and melting the frit crystals to form the sealing member.

BRIEF DESCRIPTION OF THE DRAWINGS

The above and other embodiments and features of the invention will become more apparent by describing in detail embodiments thereof with reference to the attached drawings, in which.

DETAILED DESCRIPTION

Figure 1:
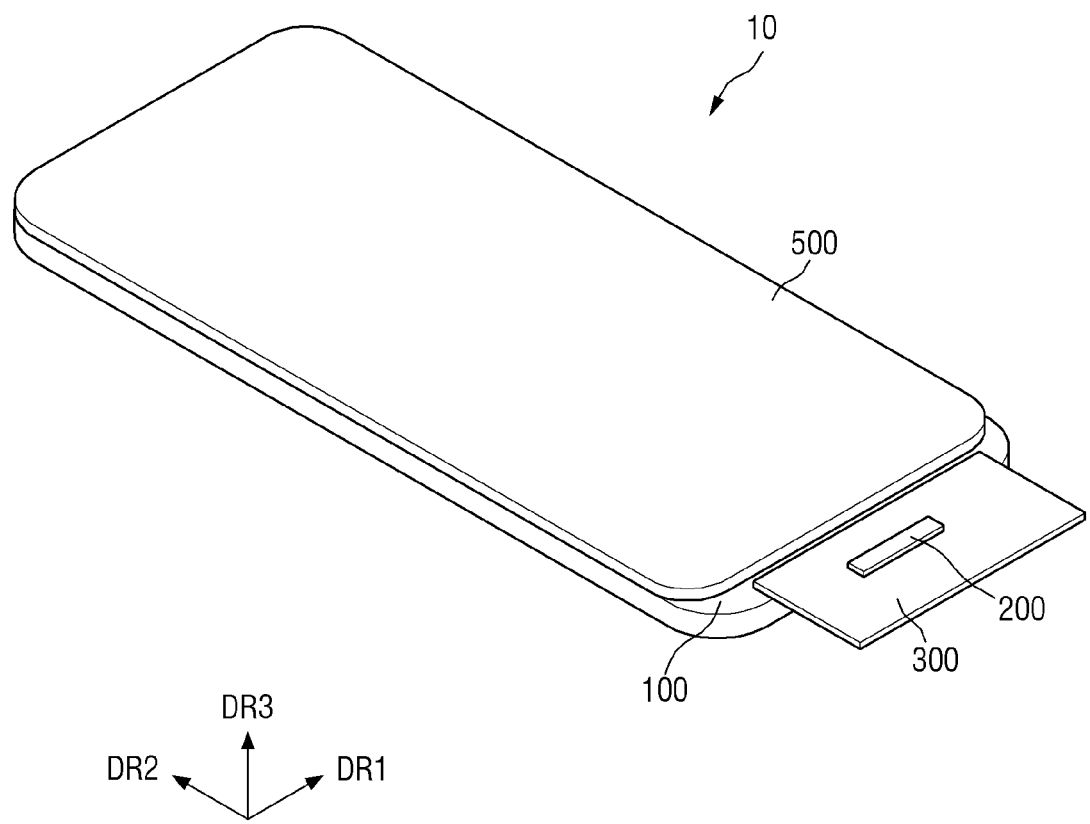
FIG. 1 is a schematic perspective view of an embodiment of a display device.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this invention will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the accompanying drawings.

Figure 2:
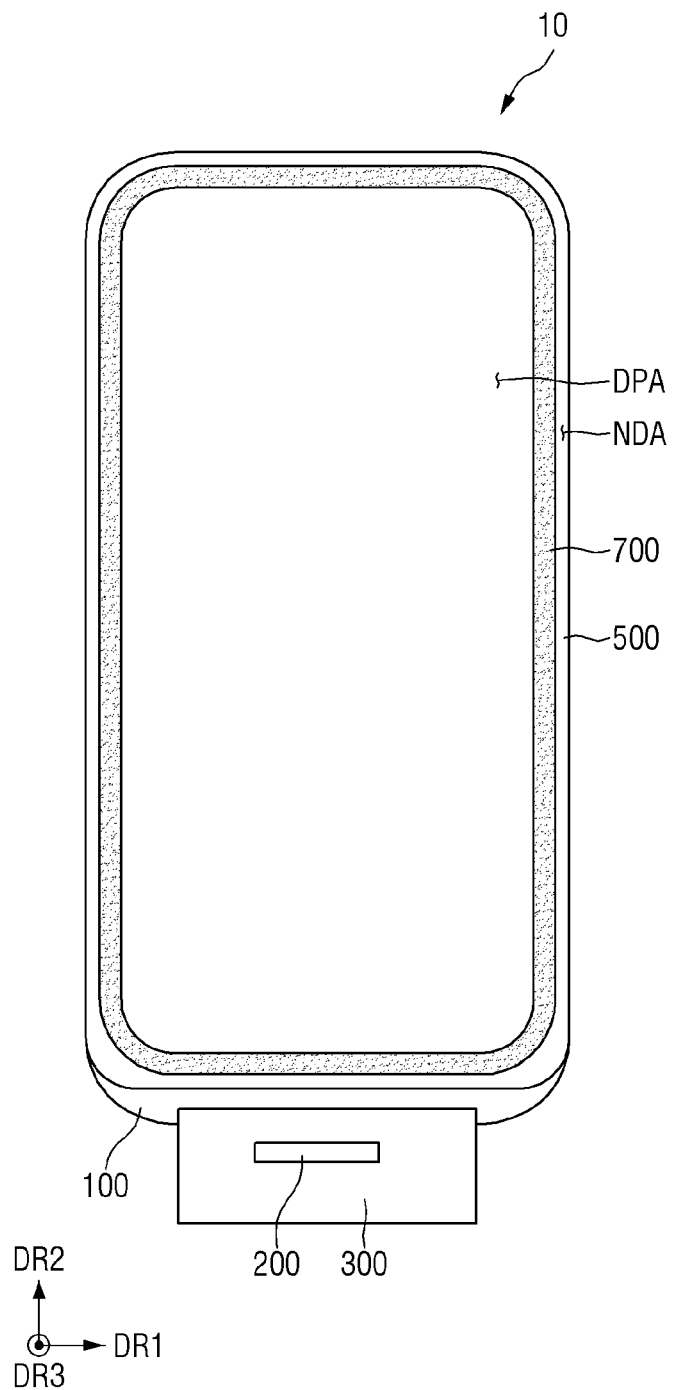
FIG. 2 is a plan view of an embodiment of a display device.
Figure 3:
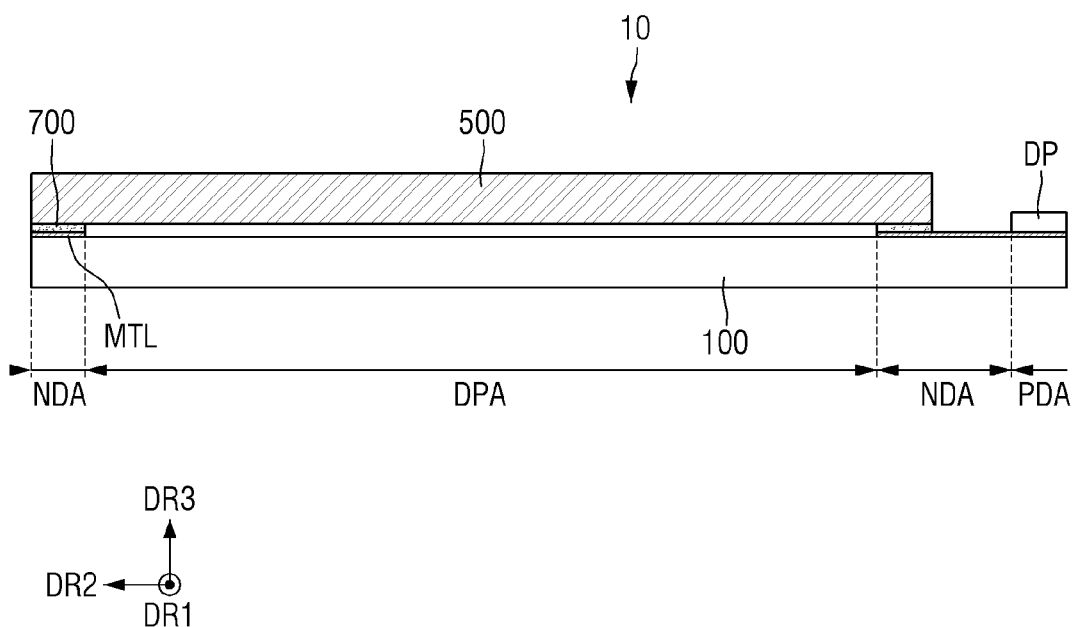
FIG. 3 is a schematic side view of an embodiment of a display device.

FIG. 1 is a schematic perspective view of an embodiment of a display device. FIG. 2 is a plan view of an embodiment of a display device. FIG. 3 is a schematic side view of an embodiment of a display device. In FIG. 3, only a display panel 100 and an encapsulation substrate 500 are illustrated without showing a display circuit board 300 of a display device 10.

In the specification, a first direction DR1 may be a direction parallel to a short side of the display device 10 in a plan view, for example, a horizontal direction of the display device 10. A second direction DR2 may be a direction parallel to a long side of the display device 10 in a plan view, for example, a vertical direction of the display device 10. A third direction DR3 may be a thickness direction of the display device 10. In addition, the first direction DR1 may be a rightward direction when the display device 10 is viewed from the third direction DR3, and an opposite direction of the first direction DR1 may be a leftward direction. The second direction DR2 may be an upward direction when the display device is viewed from the third direction DR3, and an opposite direction of the second direction DR2 may be a downward direction. The third direction DR3 may be an upward direction, and an opposite direction of the third direction DR3 may be a downward direction.

Referring to FIGS. 1 to 3, the display device 10 may be applied to a variety of electronic apparatuses, i.e., small and medium electronic devices such as a tablet personal computer ("PC"), a smartphone, a car navigation unit, a camera, a center information display ("CID") provided in a vehicle, a wristwatch-type electronic device, a personal digital assistant ("PDA"), a portable multimedia player ("PMP") and a game console, and medium and large electronic devices such as a television, an external billboard, a monitor, a personal computer and a laptop computer. These are merely suggested as examples, but the display device 10 may also be applied to other electronic devices without departing from the scope of the invention.

The display device 10 may be a light emitting display device such as an organic light emitting display using an organic light emitting diode ("OLED"), a quantum dot light emitting display including a quantum dot light emitting layer, an inorganic light emitting display including an inorganic semiconductor, and a micro light emitting display using a micro light emitting diode ("LED"). In the following description, it is assumed that the display device 10 is an organic light emitting display device, but the invention is not limited thereto.

The display device 10 includes the display panel 100 (or a first substrate), a display driver 200, the display circuit board 300, the encapsulation substrate 500 (or a second substrate), and a sealing member 700.

The display panel 100 may be provided in a quadrangular shape (e.g., rectangular shape), in a plan view, including short sides in the first direction DR1 and long sides in the second direction DR2 intersecting the first direction DR1. The corner where the short side in the first direction DR1 and the long side in the second direction DR2 meet may be rounded or right-angled. The planar shape of the display panel 100 is not limited to a rectangular shape, and may be provided in other polygonal shapes, a circular shape or elliptical shape.

The display panel 100 may be flat, but is not limited thereto. In an embodiment, the display panel 100 may include a curved portion provided at left and right ends and having a predetermined curvature or a varying curvature, for example. In addition, the display panel 100 may be flexible, e.g., bendable, foldable, or rollable.

The display panel 100 may include a display area DPA and a non-display area NDA. The display area DPA is an area where a screen may be displayed, and the non-display area NDA is an area where a screen may not be displayed. The display area DPA may also be referred to as an active region, and the non-display area NDA may also be referred to as a non-active region. The display area DPA may substantially occupy the center of the display panel 100.

The display area DPA may include a plurality of pixels PX. The plurality of pixels PX may be arranged in a matrix. However, the invention is not limited thereto, and the plurality of pixels PX may be arranged in various other forms. The shape of each pixel PX may be a rectangular or square shape in a plan view. However, the invention is not limited thereto, and it may be a rhombic shape in which each side is inclined with respect to one direction. The pixels PX may be alternately arranged in a stripe type or a pentile type. In addition, each of the pixels PX may include one or more light emitting elements (EL in FIG. 5) that emit light of a specific wavelength band to display a specific color.

The non-display areas NDA may be disposed around the display area DPA. The non-display areas NDA may completely or partially surround the display area DPA. The display area DPA may have a rectangular shape, and the non-display areas NDA may be disposed adjacent to four sides of the display area DPA. The non-display areas NDA may form a bezel of the display panel 100. Wirings or circuit drivers included in the display panel 100 may be disposed in each of the non-display areas NDA, or external devices may be disposed (e.g., mounted) thereon.

The display driver 200 outputs signals and voltages for driving the display panel 100. In an embodiment, the display driver 200 may supply data voltages to data lines. Further, the display driver 200 may supply driving voltages to driving voltage lines and may supply scan control signals to a scan driver, for example. The display driver 200 may be provided as an integrated circuit ("IC") and attached onto the display circuit board 300. In an alternative embodiment, the display driver 200 may be attached to the display panel 100 by a chip on glass ("COG") method, a chip on plastic ("COP") method, or an ultrasonic bonding method.

The display circuit board 300 may be disposed in the non-display area NDA at one edge of the display panel 100. In an embodiment, the display circuit board 300 may be disposed in the non-display area NDA of the lower edge of the display panel 100, for example. The display circuit board 300 may be bent to the bottom of the display panel 100, and one edge of the display circuit board 300 disposed on the bottom surface of the display panel 100 may be attached to the bottom surface of the display panel 100. Although not illustrated, the display circuit board 300 may be attached to and fixed to the bottom surface of the display panel 100 through an adhesive member. The adhesive member may be a pressure-sensitive adhesive. In an alternative embodiment, the display circuit board 300 may be omitted, and one edge of the display panel 100 may be bent downward.

The display circuit board 300 may be attached onto display pads of the display panel 100 using an anisotropic conductive film. Thus, the display circuit board 300 may be electrically connected to the display pads of the display panel 100. In an embodiment, the display circuit board 300 may be a flexible film, such as a flexible printed circuit board, a printed circuit board, or a chip on film.

The encapsulation substrate (second substrate) 500 is disposed on the display panel 100. In an embodiment, the encapsulation substrate 500 may be disposed to face and be spaced apart from the display panel 100 in the third direction DR3, for example. The encapsulation substrate 500 may have a planar area smaller than that of the display panel 100 and may be disposed to cover at least the display area DPA of the display panel 100. The encapsulation substrate 500 may encapsulate the light emitting elements EL (refer to FIG. 5) and the circuit elements disposed on the display panel 100 in cooperation with the sealing member 700 to be described later. In addition, in some embodiments, a touch member, a polarizing member, or the like may be further disposed on the encapsulation substrate 500.

In an embodiment, the encapsulation substrate 500 may be a transparent plate or a transparent film. In an embodiment, the encapsulation substrate 500 may include a glass material, a quartz material, or the like, for example. In some embodiments, the encapsulation substrate 500 and the light emitting element EL may be spaced apart from each other and an inert gas such as nitrogen gas may be filled therebetween. However, the invention is not limited thereto, and a filler or the like may be filled in a separation space between the encapsulation substrate 500 and the light emitting element EL.

The sealing member 700 may be disposed between the display panel 100 and the encapsulation substrate 500. In an embodiment, the sealing member 700 may be disposed in the non-display area NDA of the display panel 100 to surround the display area DPA, for example. The sealing member 700 may encapsulate the light emitting elements EL and the circuit elements of the display panel 100 together with the encapsulation substrate 500. The sealing member 700 may couple the display panel 100 and the encapsulation substrate 500 to each other. The sealing member 700 may be disposed on a metal wiring layer MTL disposed in the non-display area NDA of the display panel 100. The sealing member 700 may be in contact with the metal wiring layer MTL and the lower surface of the encapsulation substrate 500 to be combined therewith. However, the invention is not limited thereto, and the sealing member 700 may not be in contact with the metal wiring layer MTL of the display panel 100 and may couple the display panel 100 and the encapsulation substrate 500 to each other in a region where the metal wiring layer MTL is not disposed.

In some embodiments, the sealing member 700 may be a hardened frit. As used herein, the term "frit" may refer to a structure having glass properties provided by melting and hardening glass powder to which an additive is selectively added. A frit for bonding the display panel 100 and the encapsulation substrate 500 to each other may be provided by placing the glass powder between the display panel 100 and the encapsulation substrate 500 and performing a sintering and melting process. Hereinafter, a case where the sealing member 700 is a hardened frit will be described by way of example.

Since the sealing member 700 is provided through a sintering and melting process during a process of fabricating the display device 10, the display panel 100 and the encapsulation substrate 500 may be coupled to each other through physical bonding with the sealing member 700. In an embodiment, the display device 10 may include a fusion region in which a physical boundary does not exist at a boundary between the sealing member 700 and the encapsulation substrate 500 or the display panel 100. The sealing member 700 may be fused and bonded to at least the encapsulation substrate 500, and may include a fused portion having no physical boundary in addition to a portion where a physical boundary exists at a boundary with the display panel 100 and encapsulation substrate 500. The sealing member 700 may be coupled to the display panel 100 and the encapsulation substrate 500 with a stronger bonding force by including the fused portion. In particular, the sealing member 700 may have a stronger bonding force at the boundary with the encapsulation substrate 500, thereby improving durability of the display device 10 against external impact. A more detailed description thereof will be given later.

Figure 4:
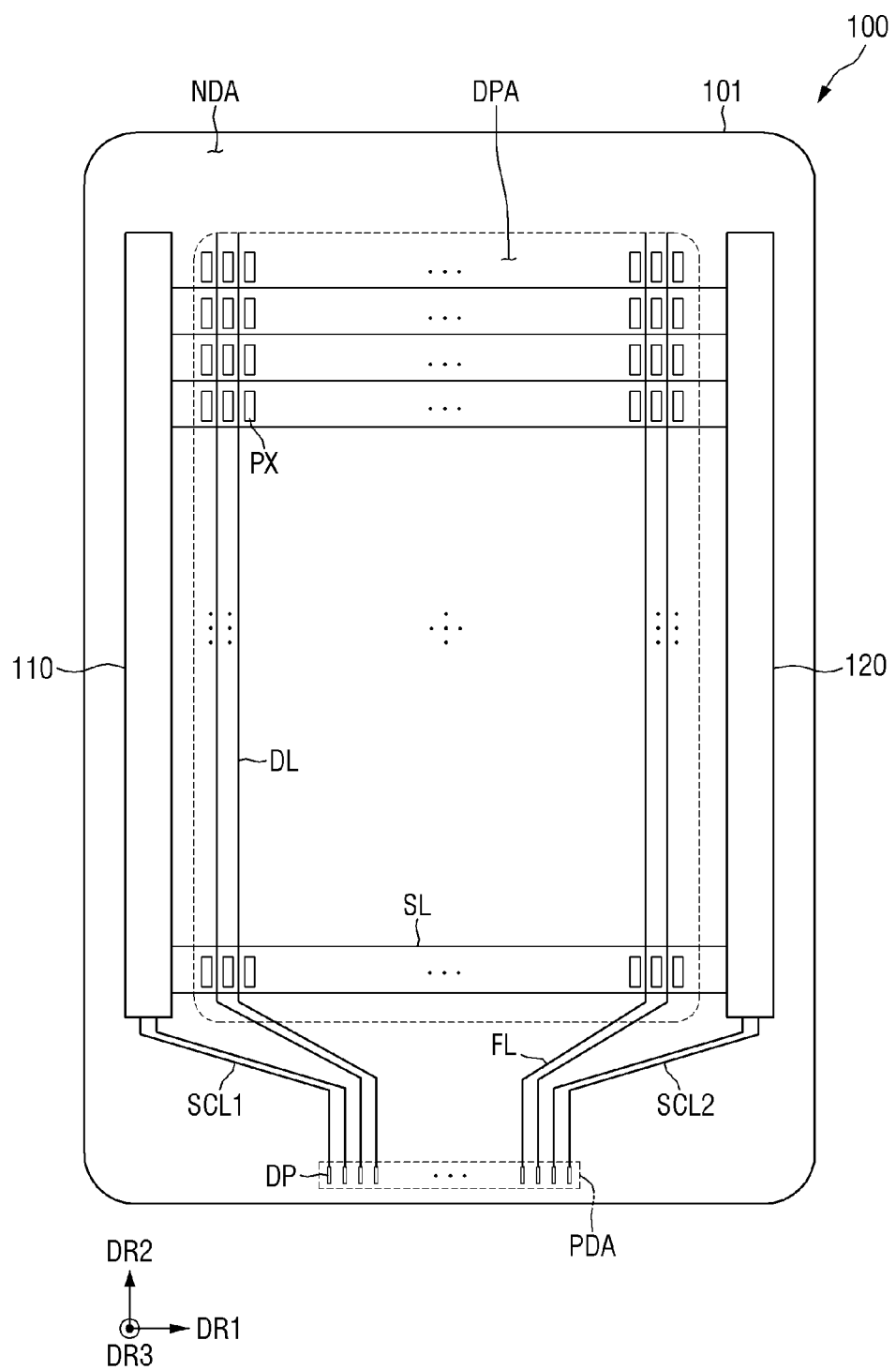
FIG. 4 is a schematic plan view of a display panel.

FIG. 4 is a schematic plan view of an embodiment of a display panel.

In FIG. 4, for simplicity of description, only pixels PX, scan lines SL, data lines DL, first scan control lines SCL1, second scan control lines SCL2, and a first scan driver 110, a second scan driver 120, the display driver 200, display pads DP, and fan-out lines FL of the display panel 100 are illustrated.

Referring to FIG. 4, the display panel 100 may include a display area DPA where pixels PX display an image, and a non-display area NDA that is a peripheral area of the display area DPA. The non-display area NDA may be an area from the outside of the display area DPA to the edge of the display panel 100.

The scan lines SL, the data lines DL and the pixels PX may be disposed in the display area DPA. The scan lines SL may extend in the first direction (X axis direction) and may be arranged side by side in the second direction (Y-axis direction) intersecting the first direction (X-axis direction), and the data lines DL may extend in the second direction (Y-axis direction) and may be arranged side by side in the first direction (X-axis direction).

Each of the pixels PX may be connected to at least one of the scan lines SL and one of the data lines DL. Each of the pixels PX may include thin film transistors including a driving transistor and at least one switching transistor, an OLED, and a capacitor. Each of the pixels PX may receive a data voltage of the data line DL when a scan signal is applied from the scan line SL, and supply a driving current to the OLED according to the data voltage applied to the gate electrode of the driving transistor, thereby emitting light. A detailed description of the pixels PX will be given later with reference to FIG. 5.

The first scan driver 110, the second scan driver 120, the display driver 200, the first scan control lines SCL1, the second scan control lines SCL2, and the fan-out lines FL may be disposed in the non-display area NDA.

The first scan driver 110 is connected to the display driver 200 through the first scan control lines SCL1. Thus, the first scan driver 110 may receive a first scan control signal of the display driver 200. The first scan driver 110 generates scan signals according to the first scan control signal and supplies the scan signals to the scan lines SL.

The second scan driver 120 is connected to the display driver 200 through the second scan control lines SCL2. Thus, the second scan driver 120 may receive a second scan control signal of the display driver 200. The second scan driver 120 generates scan signals according to the second scan control signal and supplies the scan signals to the scan lines SL.

The first scan driver 110 may be connected to the scan lines SL connected to the pixels PX of the display area DPA. The second scan driver 120 may be connected to the scan lines SL connected to the pixels PX.

The fan-out lines FL connect the display pads DP to the data lines DL, the first scan driver 110, and the second scan driver 120. That is, the fan-out lines FL may be disposed between the display pads DP and the data lines DL, between the display pads DP and the first scan driver 110, and between the display pads DP and the second scan driver 120.

A pad area PDA may include the display pads DP. The pad area PDA may be disposed at one edge of the substrate. In an embodiment, the pad area PDA may be disposed at the lower edge of the substrate, for example.

Figure 5:
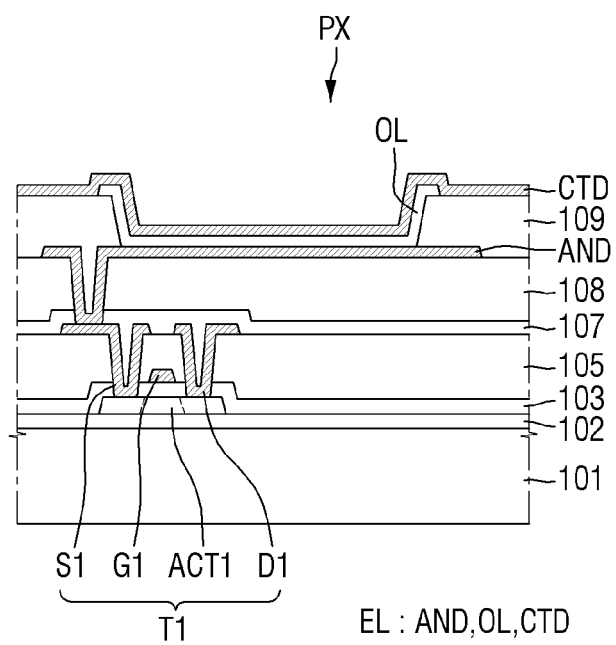
FIG. 5 is a cross-sectional view illustrating one pixel of FIG. 4.

FIG. 5 is a cross-sectional view illustrating one pixel of FIG. 4.

Referring to FIG. 5, the display panel 100 may include a base substrate 101, and a thin film transistor T1 and a light emitting element EL disposed on the base substrate 101. Each pixel PX of the display panel 100 may include at least one thin film transistor T1 and the light emitting element EL, and may be connected to the scan line SL and the data line DL. Although it is illustrated in the drawing that one thin film transistor T1 is disposed in one pixel PX, the invention is not limited thereto.

The base substrate 101 may be a rigid substrate. In an embodiment, the base substrate 101 may include an insulating material such as glass, quartz, or a polymer resin. Examples of a polymeric material may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or any combinations thereof. The base substrate 101 may include a metal material.

A buffer layer 102 may be disposed on the base substrate 101. The buffer layer 102 may be disposed on the base substrate 101 to protect the thin film transistors T1 and the light emitting elements from moisture penetrating through the base substrate 101 susceptible to moisture permeation. The buffer layer 102 may include a plurality of inorganic layers that are alternately stacked. In an embodiment, the buffer layer 102 may include a multilayer in which one or more inorganic layers of a silicon oxide (SiOx) layer, a silicon nitride (SiNx) layer and a silicon oxynitride (SiON) layer are alternately stacked, for example. In another embodiment, the buffer layer 102 may be omitted.

The thin film transistor T1 is disposed on the buffer layer 102. Each thin film transistor T1 may include an active layer ACT1, a gate electrode G1, a source electrode S1, and a drain electrode D1. Although FIG. 5 illustrates that the thin film transistor T1 is provided by a top gate method in which the gate electrode G1 is disposed above the active layer ACT1, the invention is not limited thereto. That is, the thin film transistor T1 may be provided by a bottom gate method in which the gate electrode G1 is disposed below the active layer ACT1, or a double gate method in which the gate electrode G1 is disposed both above and below the active layer ACT1.

The active layer ACT1 is disposed on the buffer layer 102. The active layer ACT1 may include a silicon-based semiconductor material or an oxide-based semiconductor material. Although not shown, a light blocking layer may be provided between the buffer layer 102 and the active layer ACT1 to block external light incident on the active layer ACT1.

A gate insulating layer 103 may be disposed on the active layer ACT1. In an embodiment, the gate insulating layer 103 may include an inorganic layer such as a silicon oxide (SiOx) layer, a silicon nitride (SiNx) layer, or a multilayer thereof.

The gate electrode G1 and a gate line may be disposed on the gate insulating layer 103. In an embodiment, the gate electrode G1 and the gate line may be provided as a single layer or multiple layers including any one of molybdenum (Mo), aluminum (Al), chromium (Cr), gold (Au), titanium (Ti), nickel (Ni), neodymium (Nd) and copper (Cu) or an alloy thereof.

An inter-insulating layer 105 may be disposed on the gate electrode G1 and the gate line. In an embodiment, the inter-insulating layer 105 may include an inorganic layer such as a silicon oxide (SiOx) layer and a silicon nitride (SiNx) layer, or a multilayer thereof.

The source electrode S1, the drain electrode D1, and the data line may be disposed on the inter-insulating layer 105. Each of the source electrode S1 and the drain electrode D1 may be connected to the active layer ACT1 through a contact hole penetrating through the gate insulating layer 103 and the inter-insulating layer 105. In an embodiment, the source electrode S1, the drain electrode D1, and the data line may be provided as a single layer or multiple layers including any one of molybdenum (Mo), aluminum (Al), chromium (Cr), gold (Au), titanium (Ti), nickel (Ni), neodymium (Nd) and copper (Cu) or an alloy thereof, for example.

A passivation layer 107 may be disposed on the source electrode S1, the drain electrode D1, and the data line to insulate the thin film transistor T1. In an embodiment, the passivation layer 107 may include an inorganic layer such as a silicon oxide (SiOx) layer and a silicon nitride (SiNx) layer, or a multilayer thereof.

A planarization layer 108 is disposed on the passivation layer 107. The planarization layer 108 may planarize a step due to the thin film transistor T1. In an embodiment, the planarization layer 108 may include an organic layer such as acryl resin, epoxy resin, phenolic resin, polyamide resin, polyimide resin and the like.

A pixel defining layer 109 and the light emitting element EL are disposed on the planarization layer 108.

The light emitting element EL may be an organic light emitting element. In this case, the light emitting element EL may include an anode electrode AND, light emitting layers OL, and a cathode electrode CTD.

The anode electrode AND may be disposed on the planarization layer 108. The anode electrode AND may be connected to the source electrode S1 of the thin film transistor T1 through a contact hole penetrating the passivation layer 107 and the planarization layer 108.

The pixel defining layer 109 may cover the edge of the anode electrode AND on the planarization layer 108 to partition the pixels. That is, the pixel defining layer 109 serves as a pixel defining layer for defining pixels. Each of the pixels represents a region where the anode electrode AND, the light emitting layer OL and the cathode electrode CTD are stacked sequentially and holes from the anode electrode AND and electrons from the cathode electrode CTD are coupled to each other in the light emitting layer OL to emit light.

The light emitting layers OL are disposed on the anode electrode AND and the pixel defining layer 109. The light emitting layer OL may be an organic light emitting layer. In an embodiment, the light emitting layer OL may emit one of red light, green light and blue light, for example. In an alternative embodiment, the light emitting layer OL may be a white light emitting layer that emits white light. In this case, the light emitting layer OL may have a structure in which a red light emitting layer, a green light emitting layer, and a blue light emitting layer are stacked, and may be a common layer provided commonly to the pixels. In this case, the display panel 100 may further include a separate color filter for displaying a red, green or blue color.

The light emitting layer OL may include a hole transporting layer, a light emitting layer, and an electron transporting layer. In addition, the light emitting layer OL may be provided in a tandem structure of two or more stacks, in which case a charge generating layer may be provided between the stacks.

The cathode electrode CTD is disposed on the light emitting layer OL. The cathode electrode CTD may cover the light emitting layer OL. The cathode electrode CTD may be a common layer provided commonly to the pixels.

In a case where the light emitting element EL of the display panel 100 is provided by a top emission method in which light is emitted upward, the anode electrode AND may include a metal material having high reflectivity to have a stacked structure (Ti/Al/Ti) of aluminum and titanium, a stacked structure ("ITO/Al/ITO") of aluminum and indium tin oxide ("ITO"), an silver-palladium-copper ("APC") alloy, and a stacked structure ("ITO/APC/ITO") of an APC alloy and ITO. The APC alloy is an alloy of silver (Ag), palladium (Pd) and copper (Cu). Further, the cathode electrode CTD may include a transparent conductive oxide ("TCO") material such as ITO or indium zinc oxide ("IZO") that may transmit light or a semi-transmissive conductive material such as magnesium (Mg), silver (Ag), or an alloy of magnesium (Mg) and silver (Ag). In a case where the cathode electrode CTD includes a semi-transmissive conductive material, the light emission efficiency may be increased due to a micro-cavity effect.

In a case where the light emitting element EL is provided by a bottom emission method in which light is emitted downward, the anode electrode AND may include a TCO material such as ITO or IZO or a semi-transmissive conductive material such as magnesium (Mg), silver (Ag), or an alloy of magnesium (Mg) and silver (Ag). The cathode electrode CTD may include a metal material, having high reflectivity, such as a stacked structure (Ti/Al/Ti) of aluminum (Al) and titanium (Ti), a stacked structure ("ITO/Al/ITO") of Al and ITO, an APC alloy, a stacked structure ("ITO/APC/ITO") of an APC alloy and ITO, or the like. In a case where the anode electrode AND includes a semi-transmissive conductive material, the light emission efficiency may be increased due to a micro-cavity effect.

Figure 6:
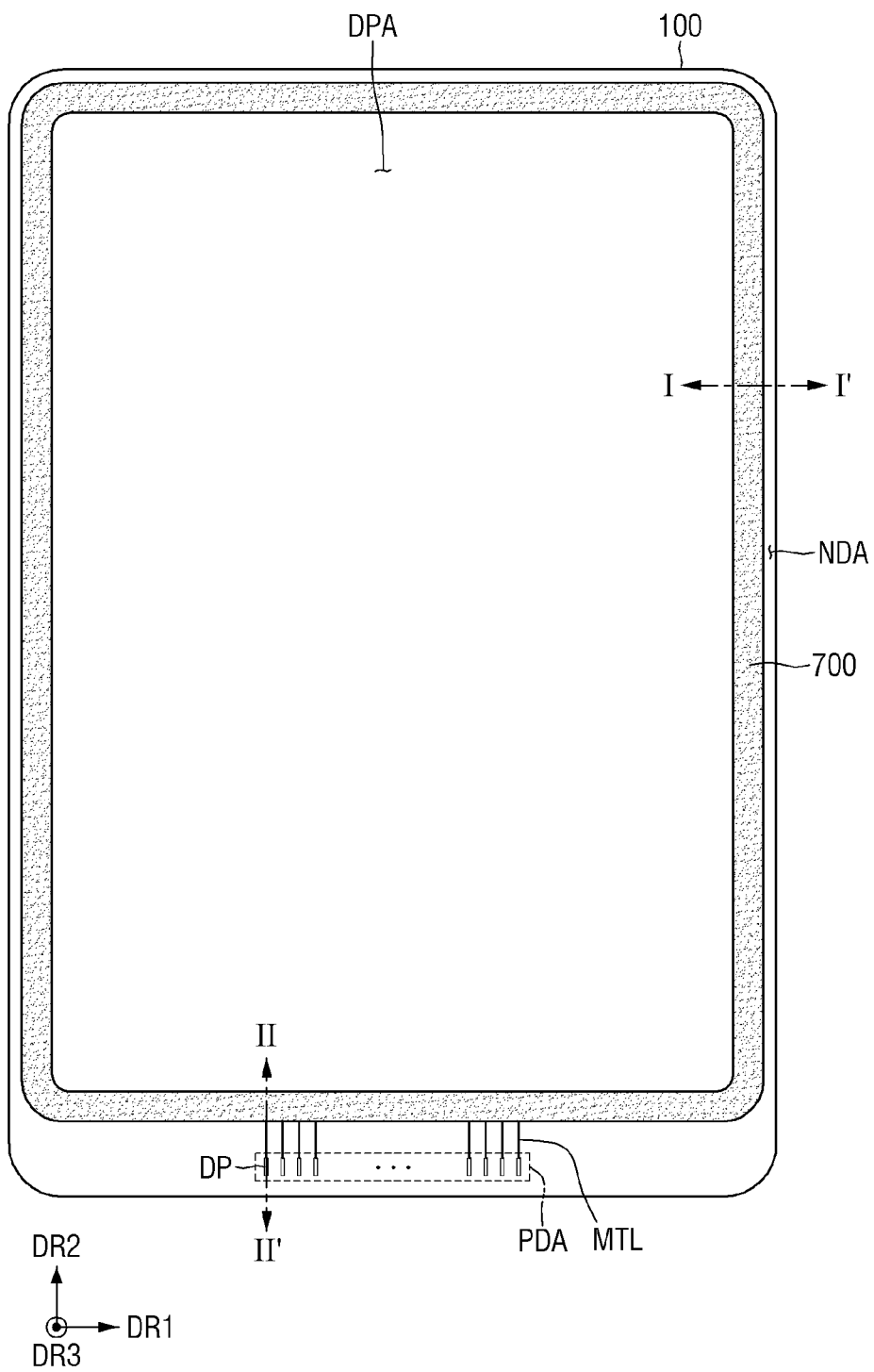
FIG. 6 is a schematic plan view illustrating an embodiment of a display device having a sealing member disposed therein.
Figure 7:
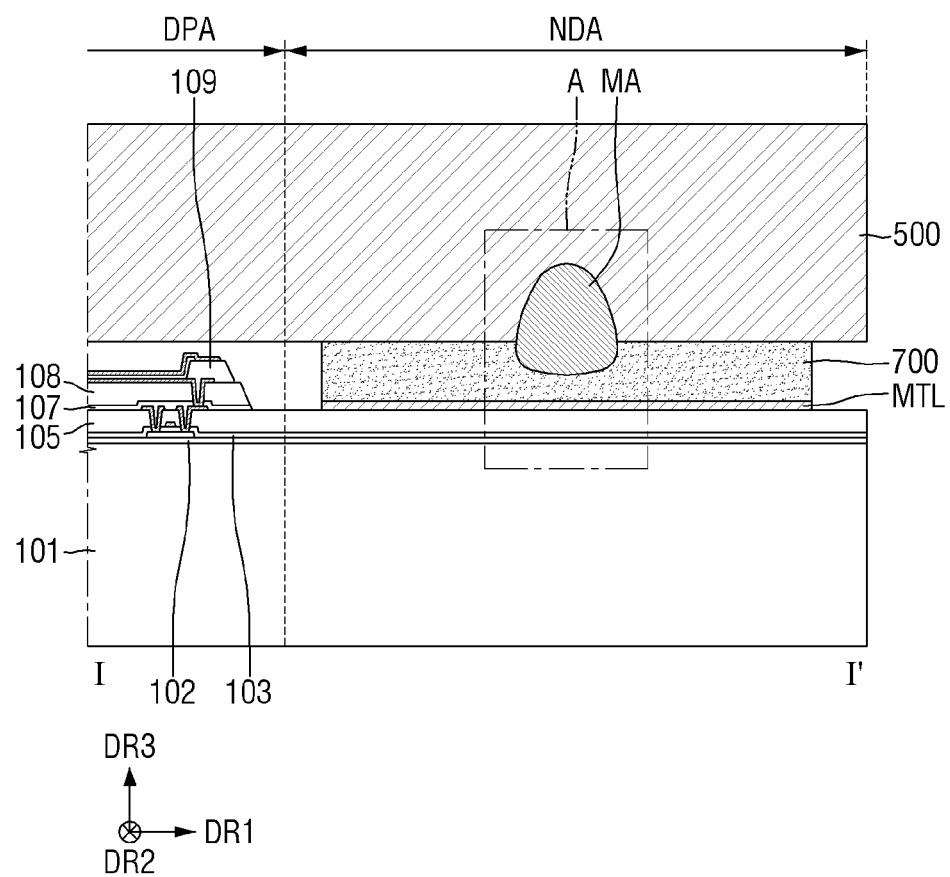
FIG. 7 is a cross-sectional view taken along line I-I' of FIG. 6.
Figure 8:
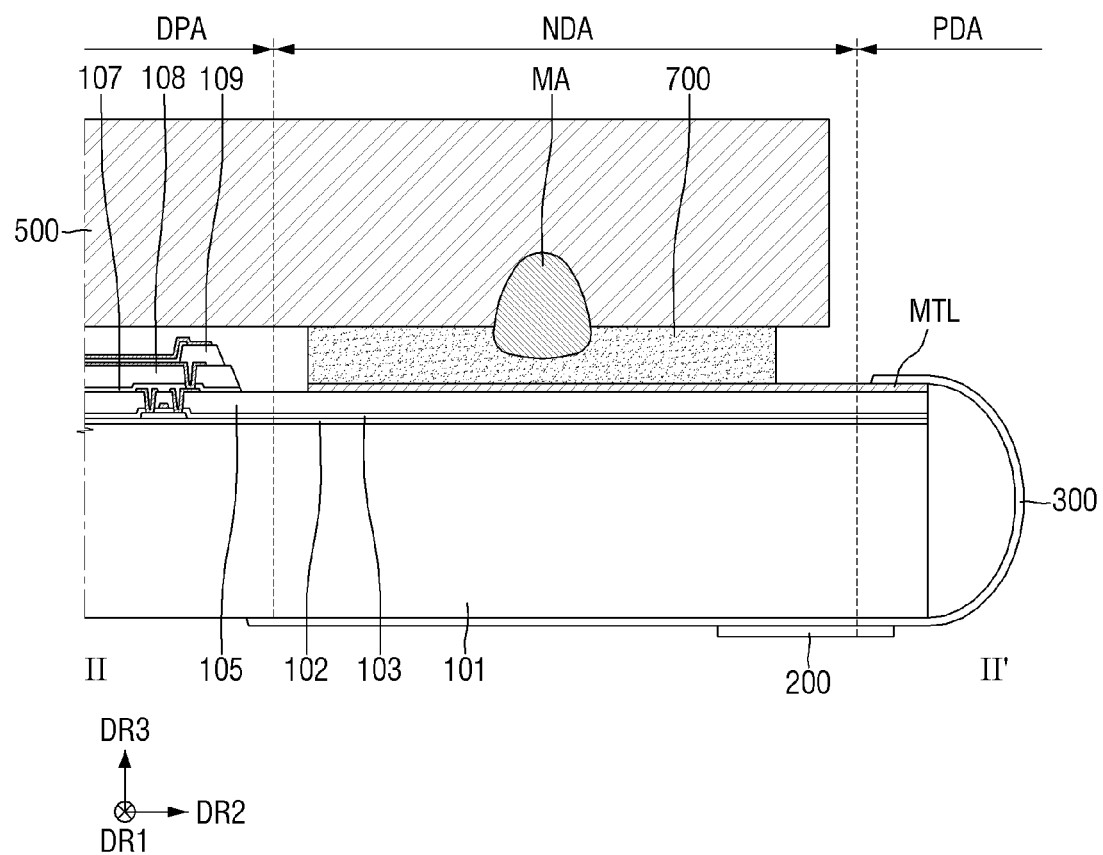
FIG. 8 is a cross-sectional view taken along line II-IP of FIG. 6.

FIG. 6 is a schematic plan view illustrating an embodiment of a display device having a sealing member disposed therein. FIG. 7 is a cross-sectional view taken along line of FIG. 6. FIG. 8 is a cross-sectional view taken along line II-IP of FIG. 6. FIGS. 7 and 8 illustrate cross sections of a portion of the non-display area NDA of the display panel 100 disposed in the first direction DR1 of the display area DPA and a portion of the non-display area NDA of the display panel 100 adjacent to the pad area PDA in the other side of the second direction DR2.

Referring to FIGS. 6 to 8, the sealing member 700 of the display device 10 may be disposed in the non-display area NDA to form a closed curve in a plan view and surround the display area DPA of the display panel 100. That is, the sealing member 700 may surround the light emitting elements EL (refer to FIG. 5) disposed in the display area DPA, and may seal a space between the encapsulation substrate 500 and the display panel 100. The sealing member 700 may prevent damage to the light emitting element EL due to air, moisture or the like in cooperation with the encapsulation substrate 500.

In an embodiment, the sealing member 700 may be disposed on the metal wiring layer MTL disposed in the non-display area NDA of the display panel 100. The metal wiring layer MTL may be disposed on the inter-insulating layer 105 of the display panel 100 in the non-display area NDA. As described above, the first scan driver 110, the second scan driver 120, the fan-out lines FL and the like may be disposed in the non-display area NDA of the display panel 100. The metal wiring layer MTL disposed in the non-display area NDA may be any one of the first scan driver 110, the second scan driver 120 and the fan-out lines FL, and the sealing member 700 may be disposed to overlap the metal wiring layer MTL. In an embodiment, the metal wiring layer MTL illustrated in FIG. 7 may be any one of circuit elements or wirings disposed in the first scan driver 110 or the second scan driver 120, and the metal wiring layer MTL illustrated in FIG. 8 may be any one of the fan-out lines FL and the display pads DP connected thereto, for example. However, the invention is not limited thereto.

FIGS. 7 and 8 illustrate that the metal wiring layer MTL is disposed along the non-display area NDA, and the width of the sealing member 700 (taken along the first direction DR1 in FIG. 7) is the same as the width of the metal wiring layer MTL (taken along the first direction DR1 in FIG. 7) such that the lower surface of the sealing member 700 is entirely in contact with the metal wiring layer MTL, but the invention is not limited thereto. The metal wiring layer MTL may have a width smaller than that of the sealing member 700, and the sealing member 700 may be in direct contact with the inter-insulating layer 105 of the display panel 100. A description thereof may refer to other embodiments.

The display panel 100 and the encapsulation substrate 500 of the display device 10 may be coupled to each other through the sealing member 700. The sealing member 700 may include a frit to couple the display panel 100 and the encapsulation substrate 500 to each other through physical bonding, and may include a physical boundary between the sealing member 700 and the display panel 100 or the encapsulation substrate 500. However, the display device 10 in an embodiment may include a fusion region MA in which the sealing member 700 is fused with the encapsulation substrate 500 or the display panel 100 such that a physical boundary does not exist therebetween.

Figure 9:
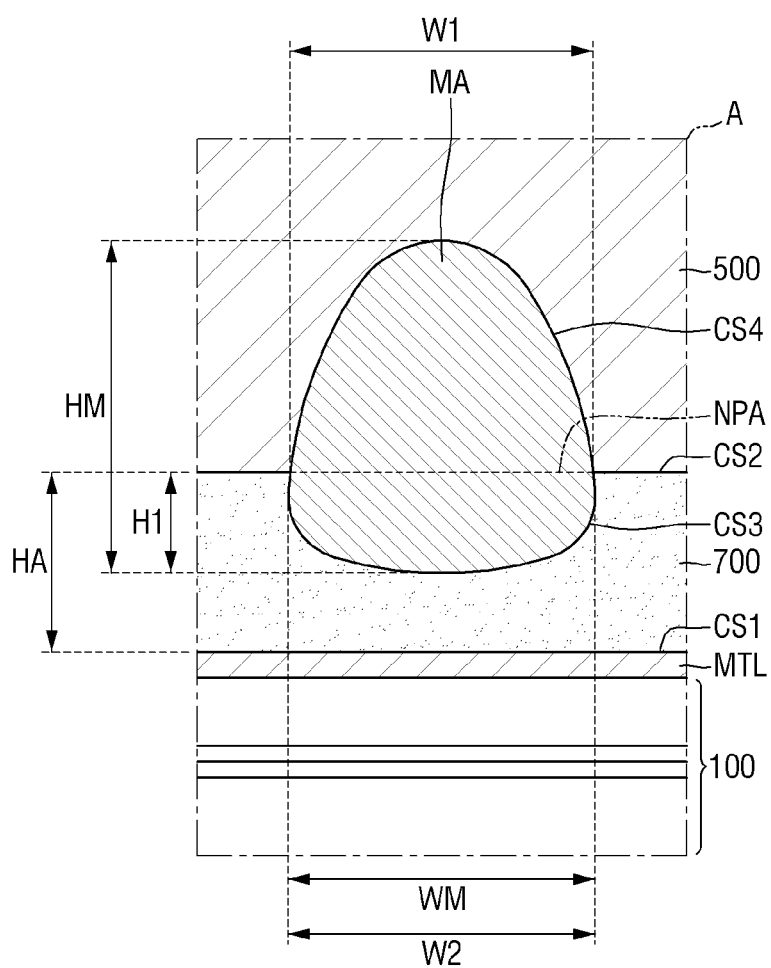
FIG. 9 is an enlarged view of portion A of FIG. 7.

FIG. 9 is an enlarged view of portion A of FIG. 7.

Referring to FIG. 9 in conjunction with FIGS. 7 and 8, the sealing member 700 may include a portion that is physically bonded at the boundary between the encapsulation substrate 500 and the display panel 100 or the metal wiring layer MTL of the display panel 100. That is, the sealing member 700 may be in direct contact with the display panel 100 and the encapsulation substrate 500, and a physical boundary may exist in a region where they are in contact with each other. In an embodiment, a physical boundary exists between the lower surface of the encapsulation substrate 500 and the upper surface of the sealing member 700, and between the upper surface of the display panel 100, and the lower surface of the sealing member 700, for example. The sealing member 700 may be in direct contact with the display panel 100 and the encapsulation substrate 500 to be bonded thereto.

In an embodiment, the sealing member 700 may include the fusion region MA provided at least at the boundary with the encapsulation substrate 500. The fusion region MA may be provided in at least a portion of the boundary provided by the sealing member 700 and the encapsulation substrate 500. The fusion region MA may be a region where no physical boundary exists between the sealing member 700 and the encapsulation substrate 500, and may be a region provided by mixing a material of the sealing member 700 with a material of the encapsulation substrate 500. As described above, the encapsulation substrate 500 may include a material such as glass, and the sealing member 700 including a frit may include a material similar to the encapsulation substrate 500. In the fusion region MA, a portion of the material of the sealing member 700 may be introduced into the encapsulation substrate 500, a portion of the material of the encapsulation substrate 500 may be introduced into the sealing member 700, and they may be mixed with each other. Accordingly, in a portion where the fusion region MA is provided, a physical boundary between the upper surface of the sealing member 700 and the lower surface of the encapsulation substrate 500 may not exist, and the materials of the sealing member 700 and the encapsulation substrate 500 may be mixed to form the fusion region MA. As a result, a bonding force between the sealing member 700 and the encapsulation substrate 500 may be improved.

The sealing member 700 may include a first boundary surface CS1 that forms a physical boundary with the upper surface of the display panel 100 or the upper surface of the metal wiring layer MTL, and a second boundary surface CS2 that forms a physical boundary with the lower surface of the encapsulation substrate 500. The fusion region MA is provided between the sealing member 700 and the encapsulation substrate 500. A third boundary surface CS3 may be between the sealing member 700 and the fusion region MA, and a fourth boundary surface CS4 may be provided between the encapsulation substrate 500 and the fusion region MA. The first boundary surface CS1 and the second boundary surface CS2 are surfaces where the sealing member 700 is in contact with the display panel 100 and the encapsulation substrate 500, respectively, and may be boundaries where the sealing member 700, the display panel 100 and the encapsulation substrate 500 are physically divided. In the first boundary surface CS1 and the second boundary surface CS2, the material of the sealing member 700 does not move to the display panel 100 or the encapsulation substrate 500, or is not mixed with the material of the display panel 100 or the encapsulation substrate 500. The sealing member 700 may maintain a state where the sealing member 700 is bonded to the display panel 100 and the encapsulation substrate 500 at the first boundary surface CS1 and the second boundary surface CS2, respectively.

The fusion region MA is a region where the materials of the sealing member 700 and the encapsulation substrate 500 are mixed. A portion (NPA in FIG. 9) where the physical boundary does not exist may be provided in a portion in which the fusion region MA is provided in the extended portion of the second boundary surface CS2. That is, at least a portion of the boundary between the sealing member 700 and the encapsulation substrate 500 may have no physical boundary, and the fused region MA may be provided therein. The third boundary surface CS3 and the fourth boundary surface CS4 may be boundary surfaces provided with the fusion region MA in the sealing member 700 and the encapsulation substrate 500, respectively.

In an embodiment, the fusion region MA may be provided by mixing the materials of the sealing member 700 and the encapsulation substrate 500. Unlike the first boundary surface CS1 and the second boundary surface CS2, the third boundary surface CS3 and the fourth boundary surface CS4 may be boundaries where there are component differences according to positions, rather than physical boundaries. The fusion region MA is a region where the materials of the encapsulation substrate 500 and the sealing member 700 are mixed with each other. The fusion region MA may be a region provided as the material of the sealing member 700 moves to the encapsulation substrate 500, and the material of the encapsulation substrate 500 moves toward the sealing member 700. Since all the materials of the sealing member 700 and the encapsulation substrate 500 are included and mixed in the fusion region MA, all of the materials may be detected in the fusion region MA. In an embodiment, a frit component which is a first component of the sealing member 700 and a glass component which is a second component of the encapsulation substrate 500 may be detected in a mixed state in the fusion region MA, respectively, for example. Since only the frit component is detected in the sealing member 700 and only the glass component is detected in the encapsulation substrate 500, the third boundary surface CS3 and the fourth boundary surface CS4 of the fusion region MA may have a boundary due to a component difference, rather than a physical boundary.

In an embodiment, the fusion region MA may include the second component of the encapsulation substrate 500 in an amount greater than that of the sealing member 700 on the basis of the third boundary surface CS3, and the fusion region MA may include the first component of the sealing member 700 in an amount greater than that of the encapsulation substrate 500 on the basis of the fourth boundary surface CS4. However, on the basis of the third boundary surface CS3 and the fourth boundary surface CS4, since the sealing member 700 and the fusion region MA include a common component and the fusion region MA and the encapsulation substrate 500 include a common component, a physical boundary may not exist.

The fusion region MA may be provided by partially fusing the sealing member 700 and the encapsulation substrate 500 by an intense light (e.g., laser) irradiated from the upper surface of the encapsulation substrate 500 during a process of fabricating the display device 10. The laser may be set such that its focal point is separated from the upper surface of the encapsulation substrate 500, and mixing of the materials may occur at the boundary between the encapsulation substrate 500 and the sealing member 700. A description thereof will be given later.

As the fusion region MA is provided by the laser irradiated from the upper surface of the encapsulation substrate 500, the laser may not reach the metal wiring layer MTL disposed on the display panel 100. In an embodiment, the fusion region MA may overlap the metal wiring layer MTL in the thickness direction, but may be spaced apart from the metal wiring layer MTL. At least a portion of the sealing member 700 may be disposed on the metal wiring layer MTL, and the fusion region MA may overlap the metal wiring layer MTL in the thickness direction. However, the fusion region MA may be separated from the metal wiring layer MTL so as not to be in direct contact with the metal wiring layer MTL. The display device 10 includes the fusion region MA in which a physical boundary does not exist at the boundary between the sealing member 700 and the encapsulation substrate 500, and the bonding force between the display panel 100 and the encapsulation substrate 500 may be improved without damaging the metal wiring layer MTL disposed on the display panel 100.

Further, the width WM of the fusion region MA may vary from the encapsulation substrate 500 to the sealing member 700. In an embodiment, the fusion region MA may include a first portion (e.g., a lower portion of the fusion region MA in FIGS. 7 to 9) overlapping the sealing member 700 and a second portion (e.g., a upper portion of the fusion region MA in FIGS. 7 to 9) overlapping the encapsulation substrate 500, and the maximum value of a width W1 of the first portion may be greater than the maximum value of a width W2 of the second portion. As described above, the fusion region MA may be provided by a laser irradiated from the upper surface of the encapsulation substrate 500, and the focal point of the laser may be set to be separated from the upper surface of the encapsulation substrate 500. From the upper surface of the encapsulation substrate 500 to the sealing member 700, the range in which the laser is irradiated may be widened, and thus, mixing between materials of the encapsulation substrate 500 and the sealing member 700 may occur in a wider region. The fusion region MA may be disposed over the encapsulation substrate 500 and the sealing member 700, and may have a width increasing from the second portion overlapping the encapsulation substrate 500 to the first portion overlapping the sealing member 700. As shown in FIG. 9, the fusion region MA may have a shape in which the width of the first portion is larger than that of the second portion in cross-sectional view. However, the invention is not limited thereto.

The fusion region MA may have a width WM and a height HM varying depending on a thickness HA of the sealing member 700. In an embodiment, the height of the fusion region MA may be greater than the thickness of the sealing member 700. However, the fusion region MA may be separated from the metal wiring layer MTL while overlapping the metal wiring layer MTL in the thickness direction, and the height H1 of the first portion (e.g., a lower portion of the fusion region MA in FIG. 9) overlapping the sealing member 700 may be smaller than the thickness HA of the sealing member 700. As the height of the fusion region MA increases, the bonding force between the encapsulation substrate 500 and the sealing member 700 may be further improved.

In some embodiments, the thickness HA of the sealing member 700 may range from about 4.5 micrometers (μm) to about 6 μm, or about 5 μm, and the width WM and the height HM of the fusion region MA may range from about 8 μm to about 12 μm, or about 10 μm, for example. Further, the height H1 of the first portion of the fusion region MA may be smaller than the thickness of the sealing member 700 and may range from about 2 μm to about 4 μm such that the display panel 100 or the metal wiring layer MTL may be separated from the fusion region MA, for example. However, the invention is not limited thereto, and the width WM and the height HM of the fusion region MA may vary depending on the intensity of the laser irradiated during the process of fabricating the display device 10.

The sealing member 700 may be disposed along the non-display area NDA of the display panel 100 to form a closed curve to surround the display area DPA, and the fusion regions MA may be disposed along the sealing member 700 and spaced apart from each other to form a pattern on the entire surface of the sealing member 700.

Figure 10:
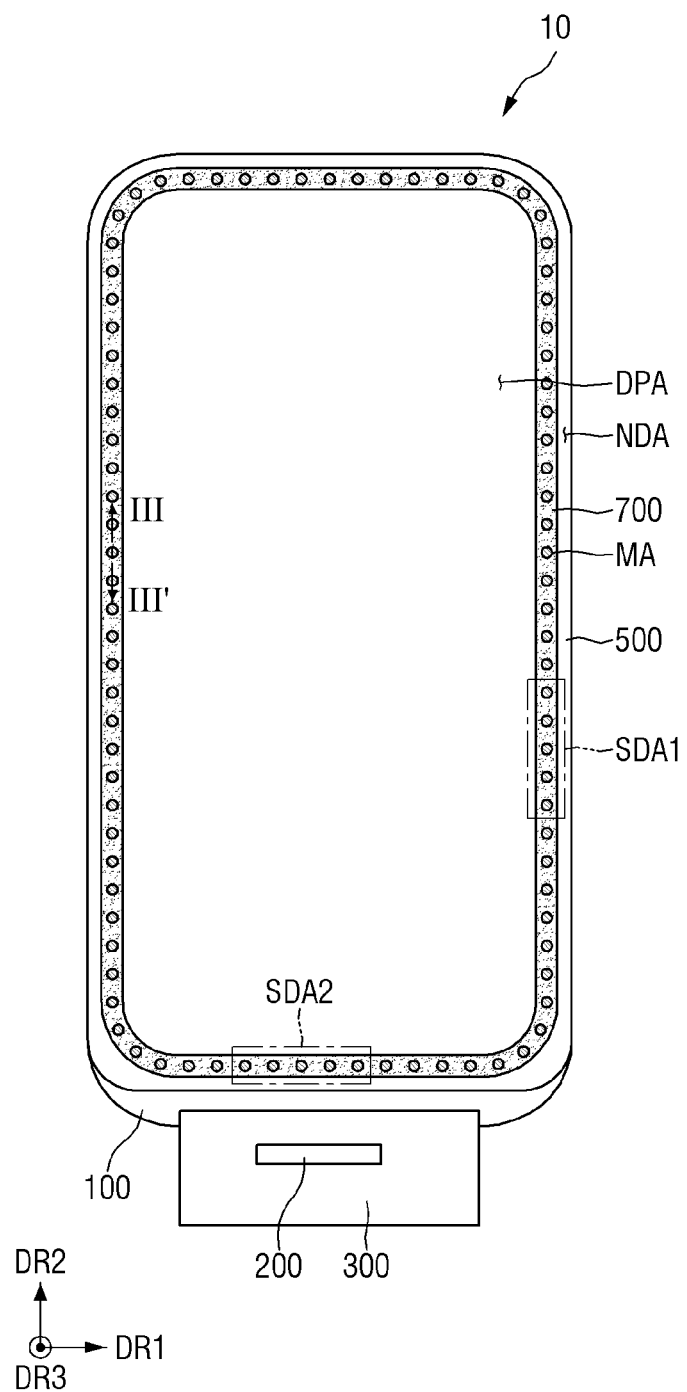
FIG. 10 is a schematic plan view illustrating an embodiment of the arrangement of fusion regions provided in a sealing member of a display device.
Figure 11:
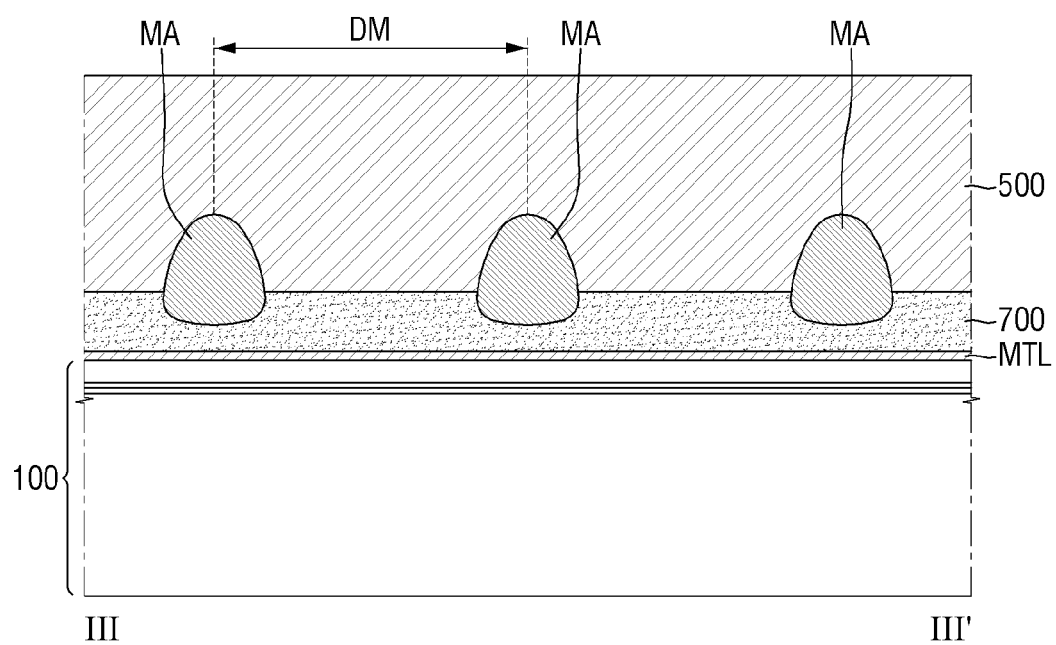
FIG. 11 is a cross-sectional view taken along line of FIG. 10.

FIG. 10 is a schematic plan view illustrating the arrangement of fusion regions provided in a sealing member of a display device. FIG. 11 is a cross-sectional view taken along line III-III' of FIG. 10.

Referring to FIGS. 10 and 11, the display device 10 in an embodiment may include a first extension portion in which the sealing member 700 extends in the first direction DR1 along the non-display area NDA, a second extension portion in which the sealing member 700 extends in the second direction DR2 along the non-display area NDA, and at least one corner portion having a curvature connected to the first extension portion and the second extension portion. The sealing member 700 may form a closed curve to surround the display area DPA. The sealing member 700 may include the first extension portion and the second extension portion corresponding to the short side of the display panel 100 extending in the first direction DR1 and the long side of the display panel 100 extending in the second direction DR2. Further, the sealing member 700 may include a first corner portion in which a corner portion where the first extension portion and the second extension portion meet is curved.

The fusion regions MA may be provided between the sealing member 700 and the encapsulation substrate 500 to be spaced apart from each other along the sealing member 700. In an embodiment, the plurality of fusion regions MA may be spaced apart from each other to form a pattern, and the fusion regions MA may be provided along at least the first corner portion of the sealing member 700. In the sealing member 700, which couples the display panel 100 and the encapsulation substrate 500 to each other, the fusion regions MA are provided at the first corner portion where the first extension portion and the second extension portion meet, thereby further improving the durability at the first corner portion having a relatively weak bonding force. Although FIG. 10 illustrates that the fusion regions MA having the shape of FIG. 9 are spaced apart from each other to form a pattern, the invention is not limited thereto. The fusion regions MA may have different shapes in a plan view, and the plurality of fusion regions MA may be connected to each other without being spaced apart from each other to have a predetermined length, or may form a closed curve along the sealing member 700. In addition, although it is illustrated in FIG. 10 that only one fusion region MA is provided along the first direction DR1, which is the width direction of the sealing member 700, in a left side or a right side of the sealing member 700 and only one fusion region MA is provided along the second direction DR2, which is the width direction of the sealing member 700, in an upper side or a lower side of the sealing member 700, the invention is not limited thereto. The plurality of fusion regions MA may be provided along the width direction of the sealing member 700, and may be spaced apart from each other.

When the plurality of fusion regions MA is spaced apart from each other, an interval (DM of FIG. 11), at which the fusion regions MA are spaced apart from each other, may be larger than the maximum value of the width WM (refer to FIG. 9) of the fusion region MA. In an embodiment, the interval DM at which the plurality of fusion regions MA are spaced apart from each other may be greater than the maximum value of the width WM of the fusion region MA, and in some embodiments, the interval DM at which the plurality of fusion regions MA are spaced apart from each other may range from about 50 μm to about 100 μm, for example. However, the invention is not limited thereto.

Hereinafter, a method of fabricating the display device 10 in an embodiment will be described.

Figure 12:
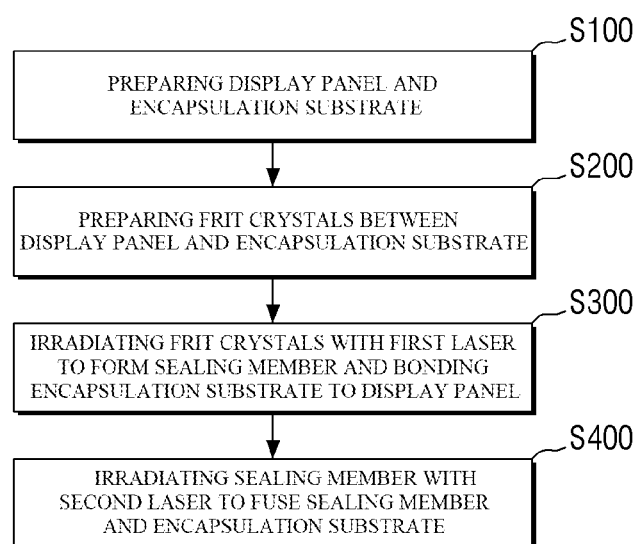
FIG. 12 is a flowchart showing an embodiment of a method for fabricating a display device.

FIG. 12 is a flowchart showing an embodiment of a method for fabricating a display device.

Referring to FIG. 12, in an embodiment, the method of fabricating the display device 10 includes preparing the display panel 100 and the encapsulation substrate 500 (operation S100), bonding the display panel 100 and the encapsulation substrate 500 via the sealing member 700, irradiating a laser to the sealing member 700 to form the fusion region MA having no physical boundary between the encapsulation substrate 500 and the sealing member 700. The operation of bonding the display panel 100 and the encapsulation substrate 500 to each other may include preparing frit crystals (operation S200) therebetween and melting the frit crystals by irradiating a laser to the frit crystals after sintering. Here, the laser irradiated to melt the frit crystals may have an intensity different from the laser irradiated to form the fusion region MA. A more detailed description thereof will be made with reference to other drawings.

FIGS. 13 to 16 are cross-sectional views illustrating an embodiment of a process of fabricating a display device.

Figure 13:
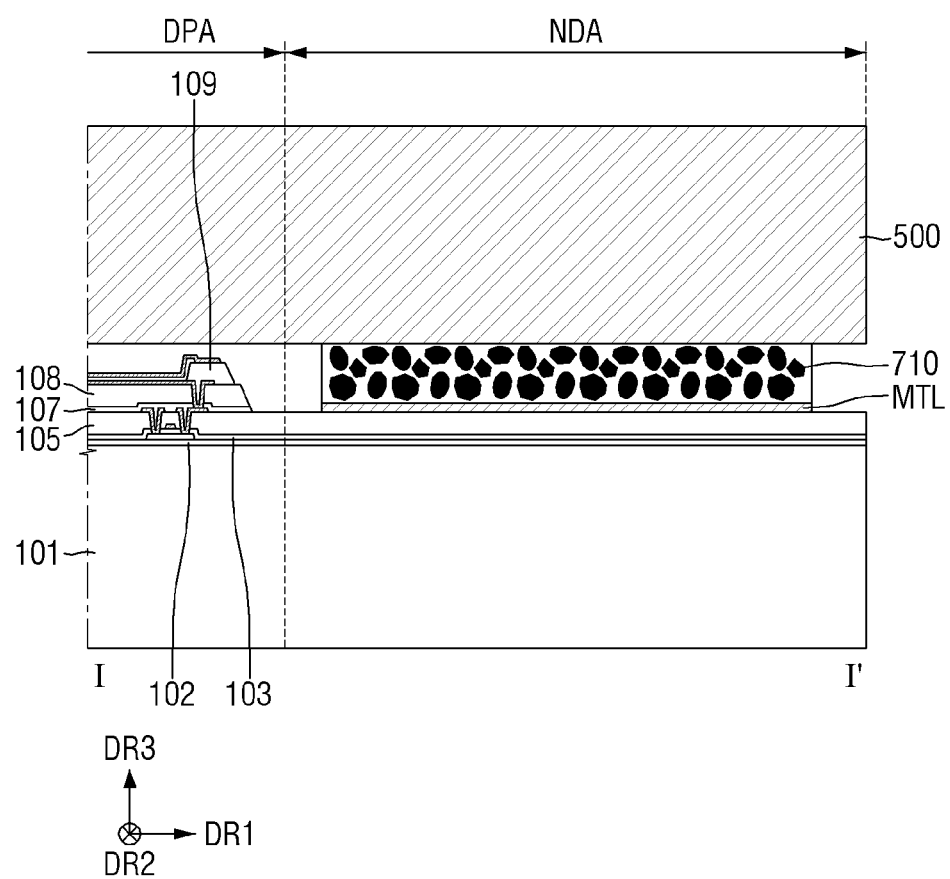
FIGS. 13 to 16 are cross-sectional views illustrating a process of fabricating a display device.

First, referring to FIG. 13 in conjunction with FIG. 12, the display panel 100 and the encapsulation substrate 500 are prepared (operation S100), and frit crystals 710 are prepared between the display panel 100 and the encapsulation substrate 500 (operation S200). The frit crystals 710 may be prepared by performing printing, drying and sintering processes on the non-display area NDA of the display panel 100, i.e., the outside of the display area DPA. In some embodiments, the frit crystals 710 may be glass powder to which an additive is selectively added. As described above, the sealing member 700 may include a frit, and the frit crystals 710 may be melted and hardened to form a structure having glass properties, thereby forming the sealing member 700.

Figure 14:
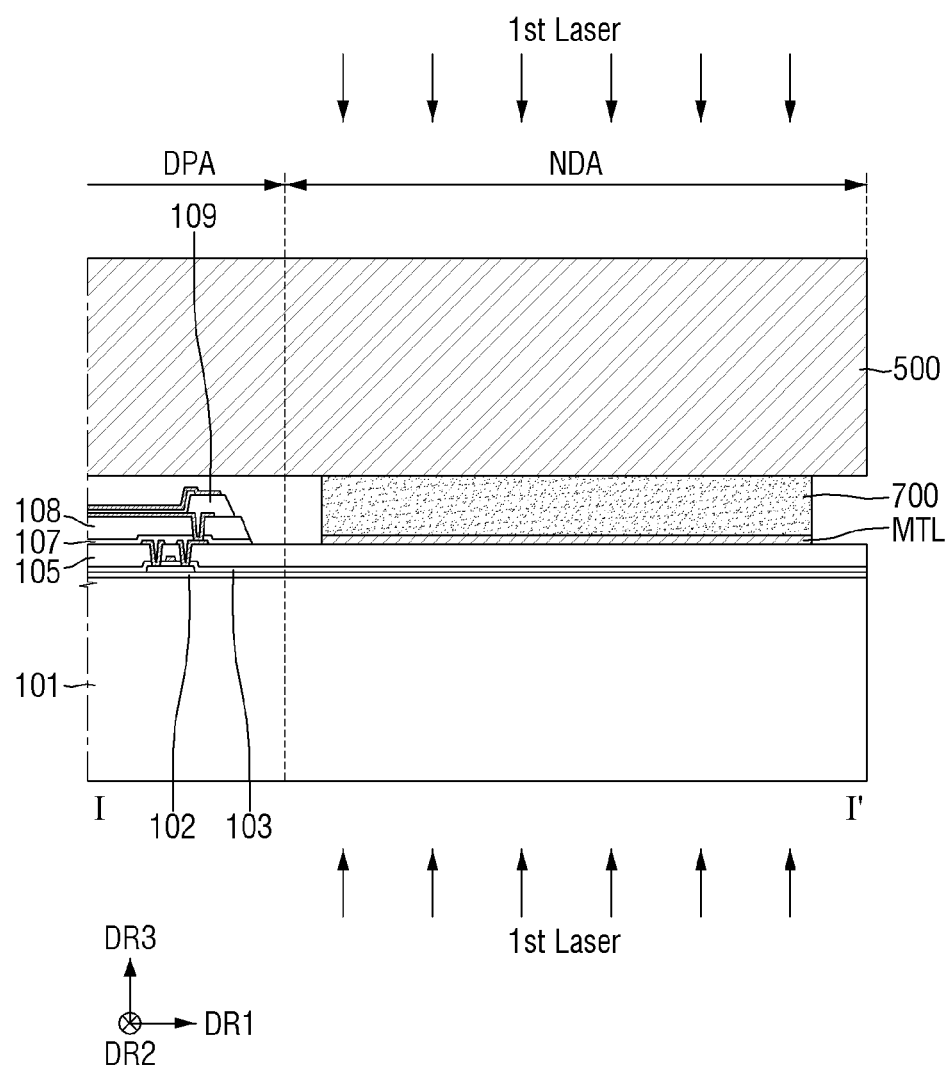

Subsequently, referring to FIG. 14, the frit crystals 710 are irradiated with a first laser to form the sealing member 700, thereby bonding the encapsulation substrate 500 to the display panel 100 (operation S300). The first laser may be irradiated from the upper surface of the encapsulation substrate 500 or the lower surface of the display panel 100. The encapsulation substrate 500 may include a transparent material, and the first laser may be irradiated to the frit crystals 710 after passing through the encapsulation substrate 500. Also in the case of the display panel 100, the base substrate 101 may include a transparent material, and the first laser may be irradiated to at least the metal wiring layer MTL. The metal wiring layer MTL includes a metal material, and when the first laser is irradiated thereto, heat may be generated and transferred to the frit crystals 710. That is, the first laser irradiated from the upper surface of the encapsulation substrate 500 or the lower surface of the display panel 100 may transfer energy to the frit crystals 710 directly or indirectly, and the frit crystals 710 may form the sealing member 700 through a melting and hardening process. Although it is illustrated in the drawing that the first laser is irradiated from the upper surface of the encapsulation substrate 500 and the lower surface of the display panel 100, the invention is not limited thereto. In some embodiments, the first laser may be irradiated from only one of the upper surface of the encapsulation substrate 500 and the lower surface of the display panel 100, or may be irradiated from another direction, e.g., from the side of the frit crystals 710.

When the first laser is irradiated, only the frit crystals 710 are melted and the display panel 100 or the metal wiring layer MTL and the encapsulation substrate 500 are not melted. The sealing member 700 provided from the frit crystals 710 through the melting and curing process may be physically bonded to the display panel 100 or the metal wiring layer MTL and the encapsulation substrate 500. When the frit crystals 710 are melted, the frit crystals 710 are transformed into a state having a viscosity. When the frit crystals 710 are hardened again to form the sealing member 700, while the frit crystals 710 lose the viscosity, the metal wiring layer MTL and the encapsulation substrate 500 may be bonded to the sealing member 700. The sealing member 700 may be in direct contact with the metal wiring layer MTL and the encapsulation substrate 500 to bond the metal wiring layer MTL and the encapsulation substrate 500 to each other and a physical boundary may exist at the boundary between the sealing member 700 and the metal wiring layer MTL and at the boundary between the sealing member 700 and the encapsulation substrate 500.

Figure 15:
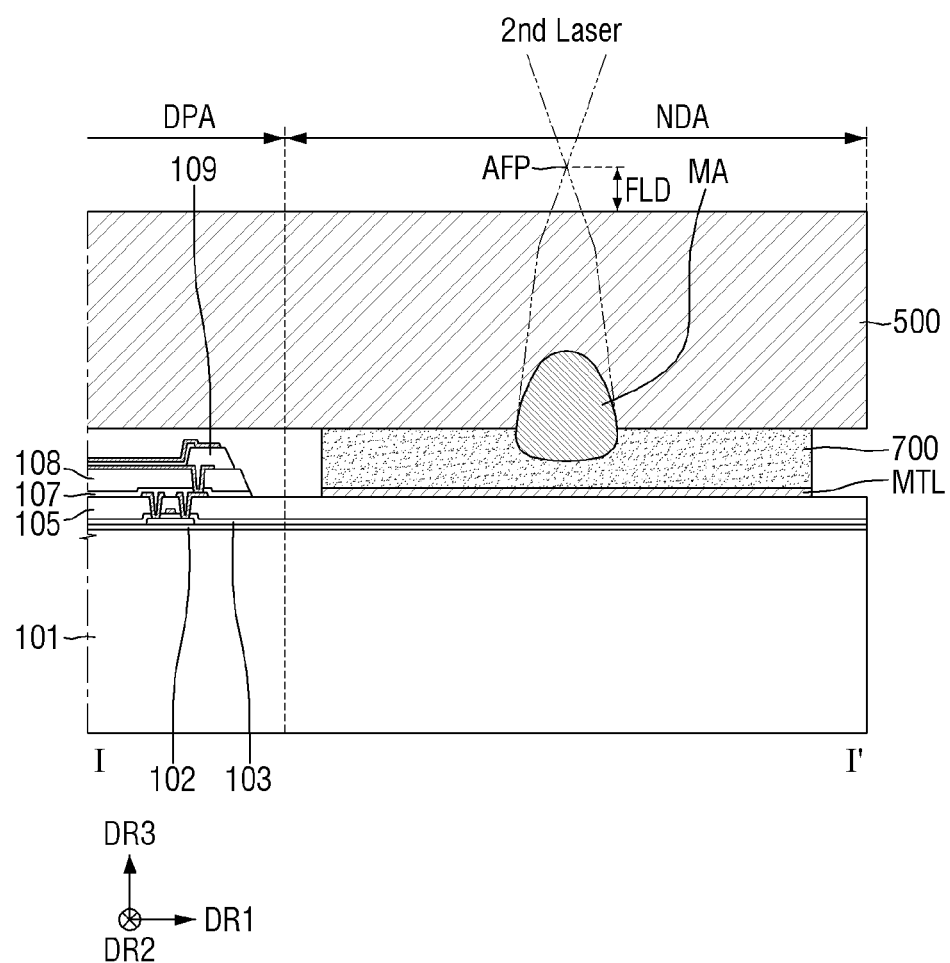
Figure 16:
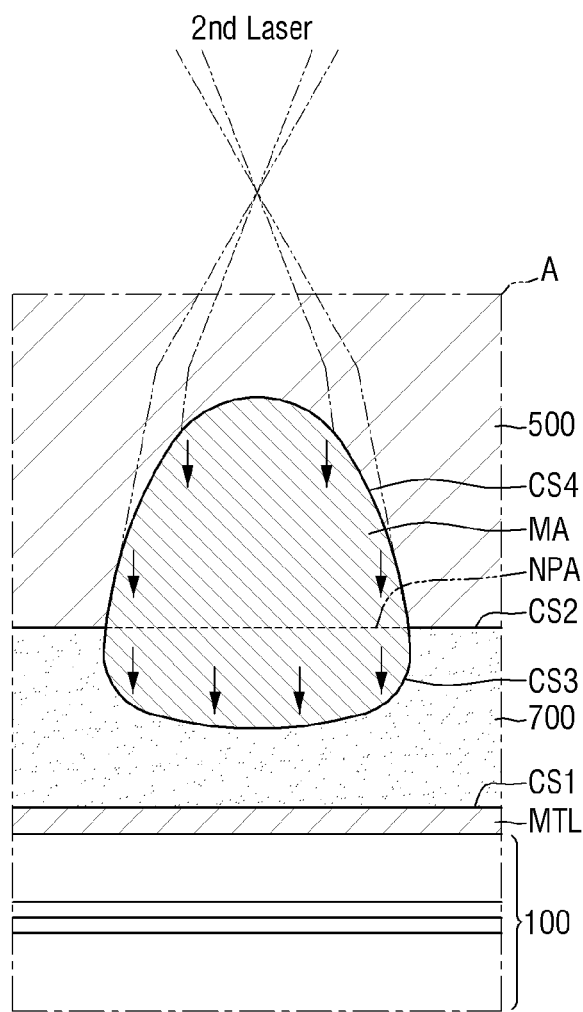

Subsequently, referring to FIGS. 14 and 15, the sealing member 700 is irradiated with a second laser to form the fusion region MA, and the sealing member 700 and the encapsulation substrate 500 are partially fused (operation S400). The second laser may be selectively irradiated at the boundary between the encapsulation substrate 500 and the sealing member 700 to form the fusion region MA having no physical boundary. In an embodiment, the second laser may be a pulsed laser having a stronger intensity than that of the first laser. In some embodiments, the second laser may be irradiated at a frequency of about 1 kilohertz (kHz) to about 10 MHz for about 10 femtoseconds (fs) to about 50 picoseconds (ps), and may have an energy of about 0.1 microjoule (μJ) or more, for example. The second laser may partially fuse the materials of the encapsulation substrate 500 and the sealing member 700 at the boundary between the encapsulation substrate 500 and the sealing member 700. The fusion region MA may be a region where the material of the sealing member 700 and the material of the encapsulation substrate 500 are mixed with each other, and may be a region having no physical boundary between the sealing member 700 and the encapsulation substrate 500.

The second laser may be irradiated from the upper surface of the encapsulation substrate 500 without damaging the metal wiring layer MTL of the display panel 100. In an embodiment, a focal point AFP of the second laser may be set to be separated from the upper surface of the encapsulation substrate 500, and a distance FLD between the upper surface of the encapsulation substrate 500 and the focal point AFP of the second laser may range from about 0.1 μm to about 200 μm, for example. Since the second laser has a stronger intensity than that of the first laser, when the focal point AFP of the second laser is set inside the encapsulation substrate 500 or between the sealing member 700 and the encapsulation substrate 500, the metal wiring layer MTL of the display panel 100 MTL may be damaged. In an embodiment, the second laser is set such that the focal point AFP is separated from the upper surface of the encapsulation substrate 500, i.e., outside the display device 10. Thus, even though the second laser is irradiated to the boundary between the sealing member 700 and the encapsulation substrate 500, the fusion region MA may be separated from the metal wiring layer MTL, it is possible to prevent damage to the metal wiring layer MTL.

Further, when the second laser reaches the boundary between the sealing member 700 and the encapsulation substrate 500 through the focal point AFP, energy may be transferred to spread to a wider area than that of the focal point AFP. The fusion region MA provided at the boundary between the sealing member 700 and the encapsulation substrate 500 may have a shape in which the width increases from the focal point AFP of the second laser to the sealing member 700, or from the encapsulation substrate 500 to the sealing member 700.

The method of fabricating the display device 10 in an embodiment may include forming the fusion region MA by irradiating the second laser after the display panel 100 and the encapsulation substrate 500 are bonded to each other via the sealing member 700. The display device 10 includes the fusion region MA having no physical boundary at least between the encapsulation substrate 500 and the sealing member 700, and the bonding force between the sealing member 700 and the encapsulation substrate 500 may be improved, thereby improving durability of the display device 10 against external impact.

Hereinafter, various embodiments of the display device 10 will be described with reference to other drawings.

Figure 17:
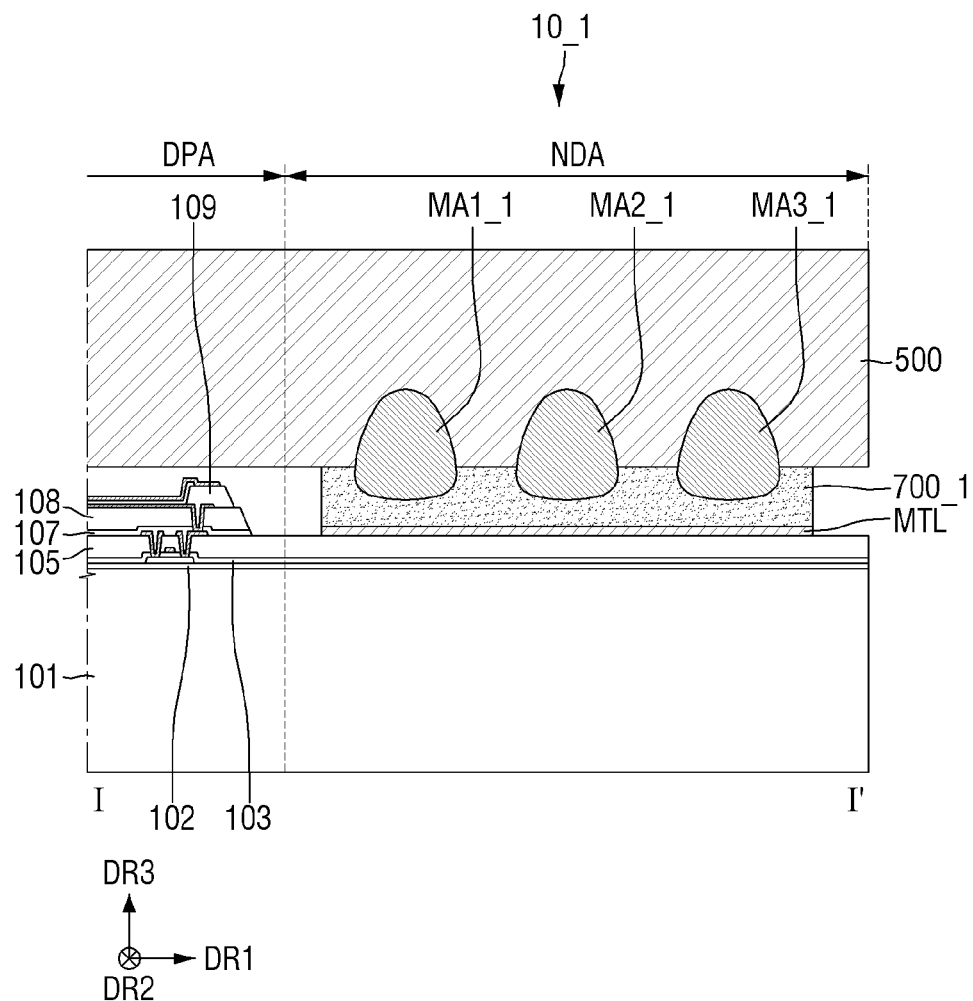
FIG. 17 is a cross-sectional view illustrating a portion of a display device.
Figure 18:
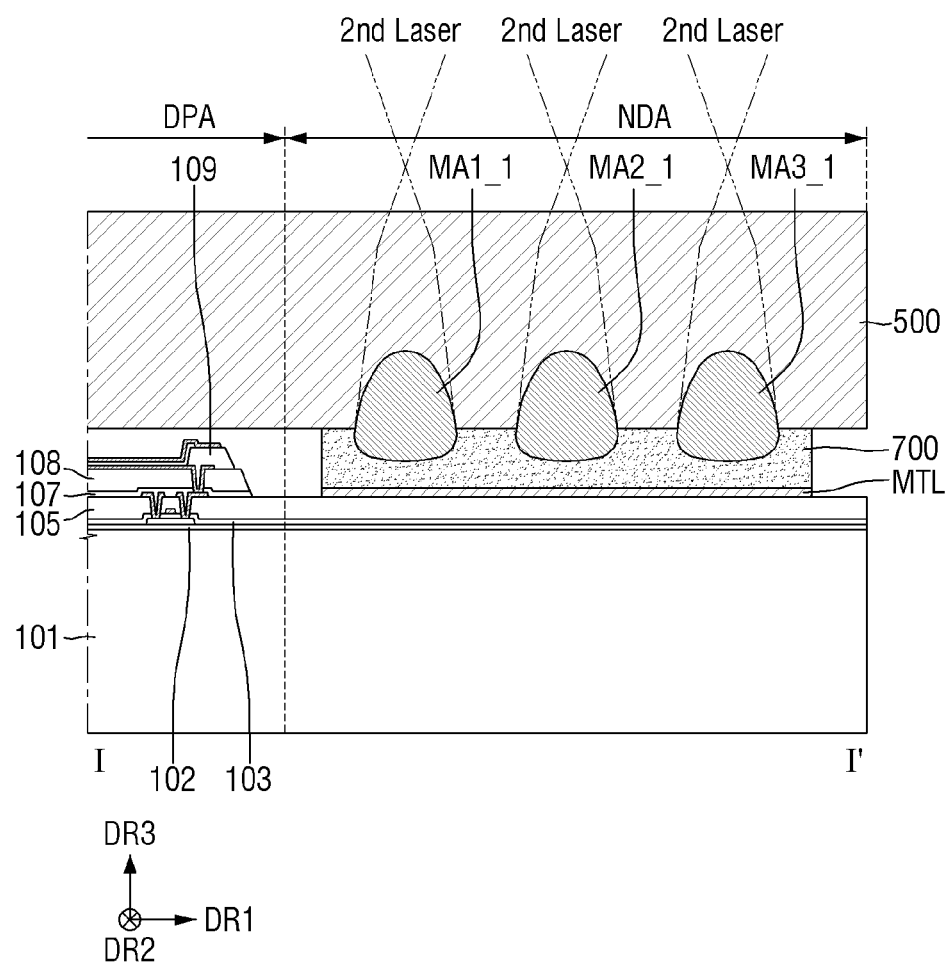
FIG. 18 is a cross-sectional view partially illustrating a process of fabricating the display device of FIG. 17.

FIG. 17 is a cross-sectional view illustrating another embodiment of a portion of a display device. FIG. 18 is a cross-sectional view partially illustrating a process of fabricating the display device of FIG. 17.

Referring to FIGS. 17 and 18, a display device 10_1 in an embodiment may include a greater number of fusion regions MA_1 provided in the width direction of a sealing member 700_1. The embodiment of FIGS. 17 and 18 differs from the embodiment of FIG. 7 in that a larger number of fusion regions MA_1 is provided in the width direction of the sealing member 700_1. In the following description, a redundant description will be omitted and differences will be mainly described.

The sealing member 700_1 of the display device 10_1 may have a width measured in the first direction DR1. In the embodiment of FIG. 7, one fusion region MA is provided in the width direction of the sealing member 700_1. However, the invention is not limited thereto, and a plurality of second lasers (2nd Lasers in FIG. 18) may be irradiated in the width direction of the sealing member 700_1, and the display device 10_1 may include a plurality of fusion regions MA_1 spaced apart from each other in the width direction of the sealing member 700_1. The fusion regions MA_1 may include a first fusion region MA1_1 adjacent to the display area DPA, a third fusion region MA3_1 provided at the outermost side of the non-display area NDA, and a second fusion region MA2_1 provided therebetween. The first to third fusion regions MA1_1, MA2_1 and MA3_1 may be spaced apart from each other in the first direction DR1. In addition, although not shown in the drawings, each of the first to third fusion regions MA1_1, MA2_1 and MA3_1 may be provided plurally along the second extension portion of the sealing member 700_1, and these may form patterns spaced apart from each other in the second direction DR2, respectively. In an embodiment, the display device 10_1 includes a greater number of fusion regions MA_1 arranged along the width direction of the sealing member 700_1, and thus the bonding force between the sealing member 700_1 and the encapsulation substrate 500 may be further improved.

Figure 19:
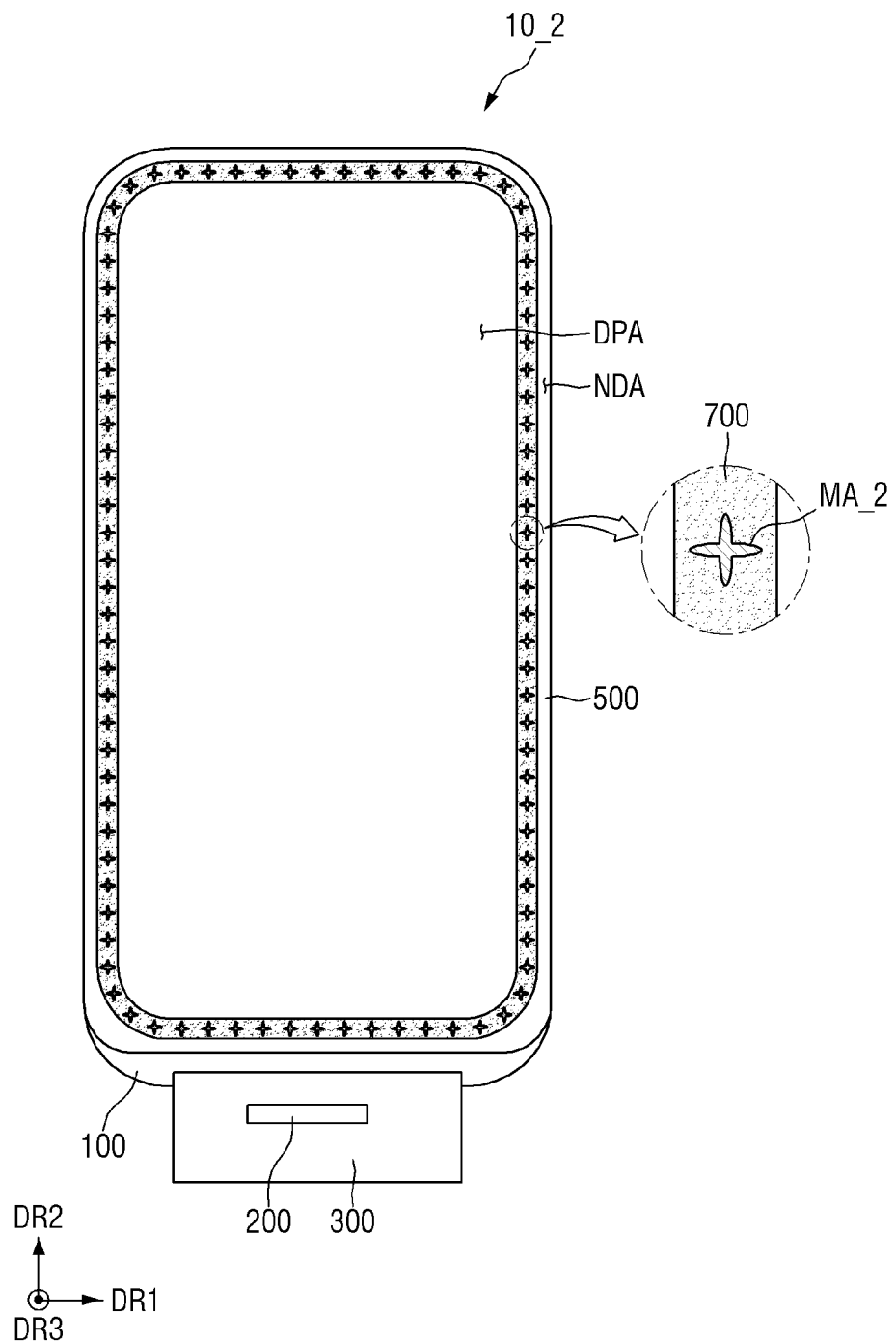
FIGS. 19 to 21 are schematic plan views illustrating the arrangement of fusion regions provided in a sealing member of a display device according to other embodiments.
Figure 20:
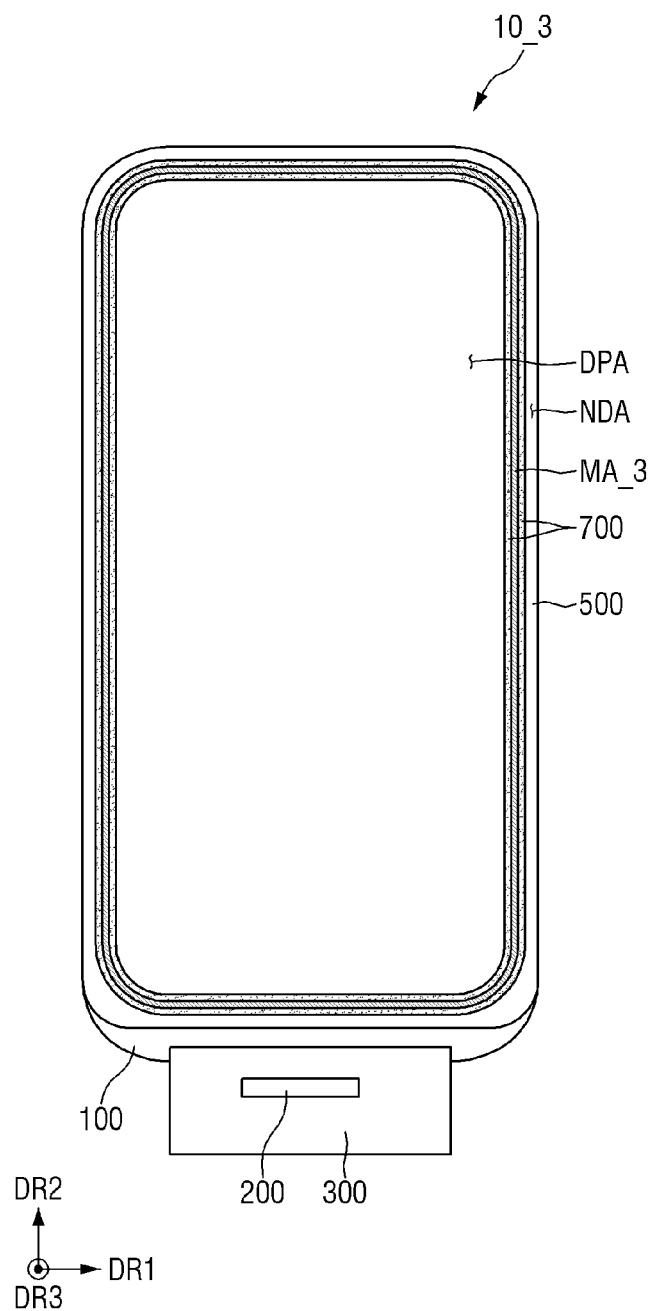
Figure 21:
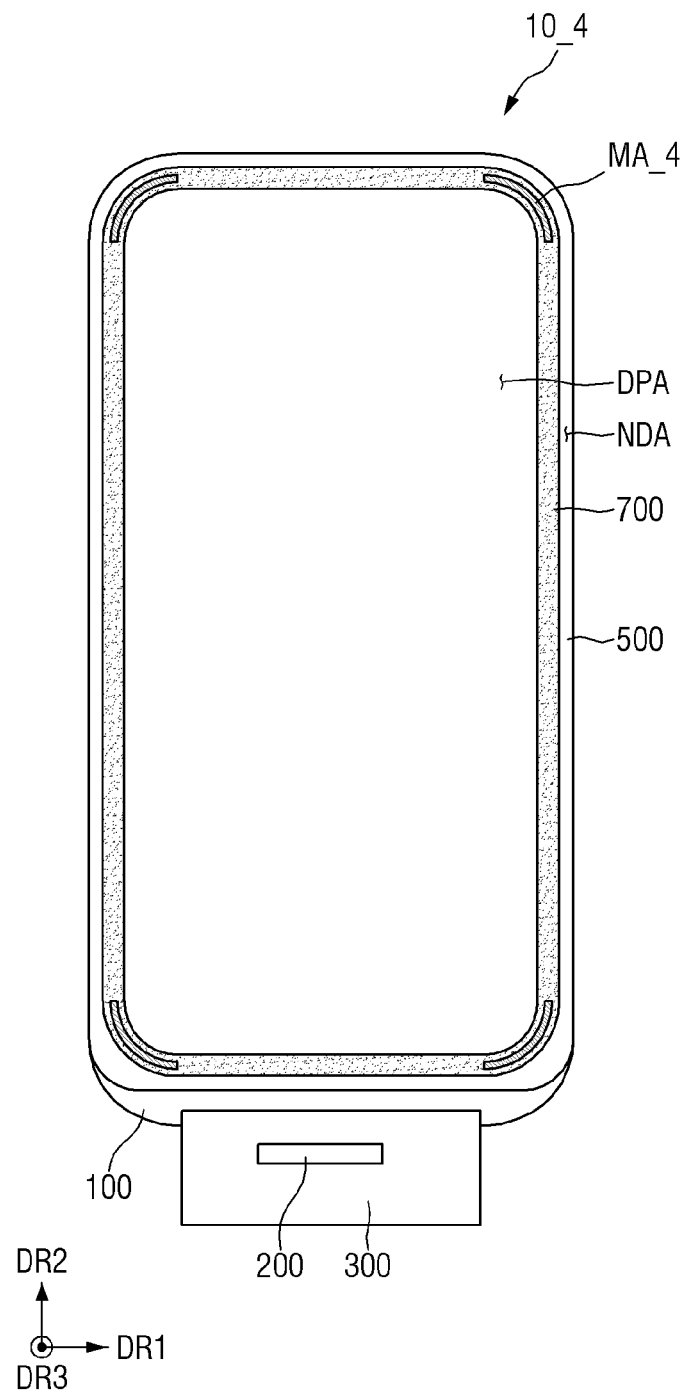

FIGS. 19 to 21 are schematic plan views illustrating the arrangement of fusion regions provided in a sealing member of a display device according to other embodiments.

Referring to FIGS. 19 to 21, the planar shape of the fusion region MA may be variously modified. First, referring to FIG. 19, a display device 10_2 in an embodiment may include a fusion region MA_2 having a shape in which portions extending in the first direction DR1 and the second direction DR2 intersect each other. The fusion region MA_2 having the above-described shape may be provided by controlling the focal point AFP and the laser width of the second laser in the process of irradiating the second laser. In an embodiment, when irradiating the second laser, by irradiating a laser having a width in the first direction DR1 and then irradiating a laser having a width in the second direction DR2 intersecting the first direction DR1, the fusion region MA_2 having the shape shown in FIG. 19 may be provided, for example. However, the invention is not limited thereto, and the shape of the fusion region MA_2 may be variously modified.

Referring to FIG. 20, a display device 10_3 may include a fusion region MA_3 which forms a closed curve to surround the display area DPA by extending the fusion region MA_3 along the sealing member 700. The fusion region MA_3 may be provided entirely at the boundary between the sealing member 700 and the encapsulation substrate 500, and may be substantially provided in the same shape as the sealing member 700. The fusion region MA_3 may include extension portions extending in the first direction DR1 and the second direction DR2 and a corner portion having a curvature at a portion where the extension portions meet. However, the width WM of the fusion region MA_3 may be smaller than the width of the sealing member 700, and at least a portion of the sealing member 700 may be in direct contact with the encapsulation substrate 500. In the embodiment of FIG. 20, since the fusion region MA_3 is provided over the entire area of the sealing member 700, the bonding force between the encapsulation substrate 500 and the sealing member 700 may be further improved.

However, the invention is not limited thereto, and the fusion region MA may be selectively provided only at a portion where the bonding force of the sealing member 700 and the encapsulation substrate 500 is weak.

A display device 10_4 of FIG. 21 may include a fusion region MA_4 provided on each corner portion where the first and second extension portions of the sealing member 700 meet. The fusion region MA_4 may have a curved shape according to the shape of the corner portion of the sealing member 700. The corner portion of the sealing member 700 may be a portion having a weak bonding force with the encapsulation substrate 500 and having a high frequency of damage due to external impact. In a process of fabricating the display device 10_4, by selectively irradiating the second laser only to a region susceptible to external impact in the boundary between the sealing member 700 and the encapsulation substrate 500, the fusion region MA_4 may be provided only in the corresponding region.

Figure 22:
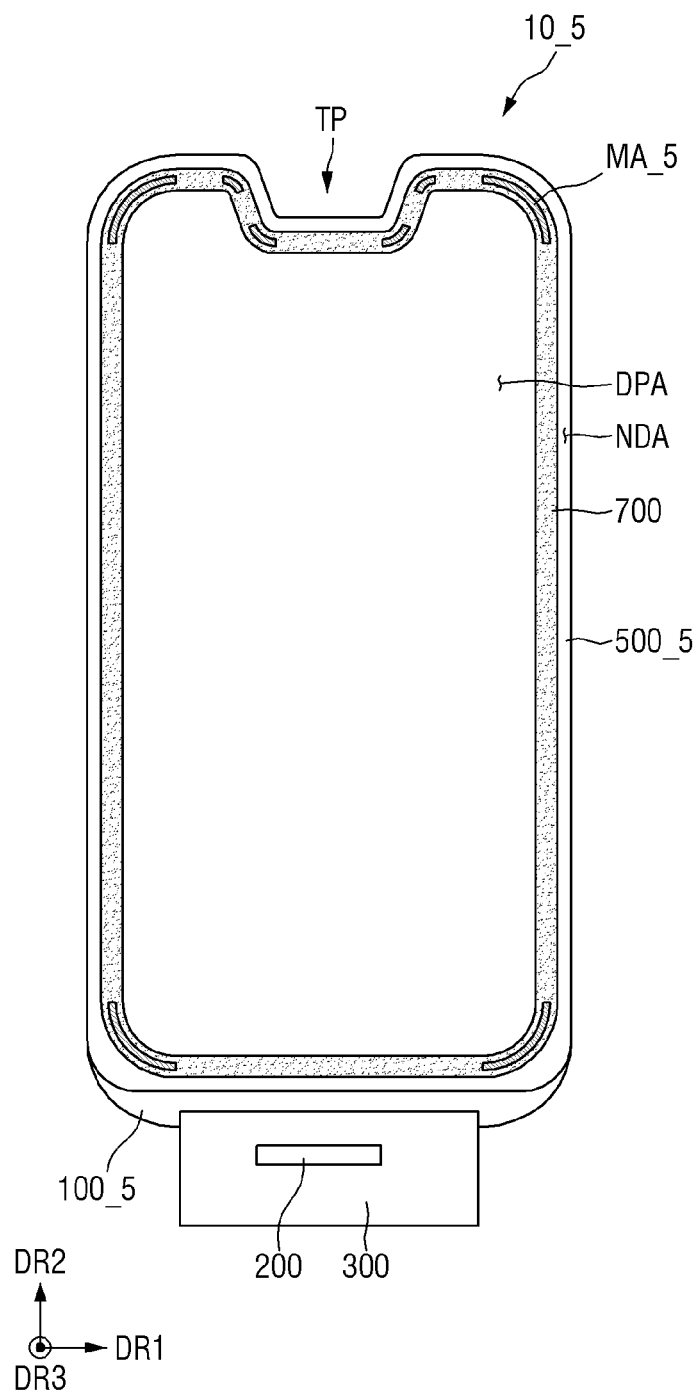
FIG. 22 is a schematic plan view illustrating another embodiment of the arrangement of fusion regions provided in a sealing member of a display device.

FIG. 22 is a schematic plan view illustrating another embodiment of the arrangement of fusion regions provided in a sealing member of a display device in another embodiment.

Referring to FIG. 22, a display device 10_5 may be configured such that a trench portion TP is defined in a display panel 100_5 and an encapsulation substrate 500_5. The trench portion TP may be defined in the display panel 100_5 and the encapsulation substrate 500_5 such that one short side of the short sides extending in the first direction DR1, which is disposed at an upper side from the center, is recessed inward. Accordingly, the non-display area NDA of the display panel 100_5 may have more corner portions, and the encapsulation substrate 500_5 may have more portions susceptible to external impact. In the display device 10_5 in an embodiment, the trench portion TP may be defined in the display panel 100_5 and the encapsulation substrate 500_5, and the fusion region MA_5 may be provided in the corner portion of the sealing member 700 corresponding to the trench portion TP. The fusion region MA_5 may correspond to each of the curved corner portions of the trench portion TP, and even when the display panel 100_5 and the encapsulation substrate 500_5 are deformed, the bonding force between the sealing member 700 and the encapsulation substrate 500_5 may be improved.

As described above, the metal wiring layer MTL disposed in the non-display area NDA may be the first scan driver 110, the second scan driver 120, the fan-out lines FL, and the like. In the above-described drawings, only the embodiment in which the metal wiring layer MTL is disposed on the entire surface of the non-display area NDA such that the lower surface of the sealing member 700 is entirely in contact with the metal wiring layer MTL is illustrated. However, the invention is not limited thereto, and the metal wiring layer MTL may have a shape having patterns spaced apart from each other at a predetermined interval. In the non-display area NDA, a portion of the insulating layer on which the metal wiring layer MTL is disposed, e.g., the inter-insulating layer 105, may be exposed. The exposed inter-insulating layer 105 may be in direct contact with the sealing member 700.

Figure 23:
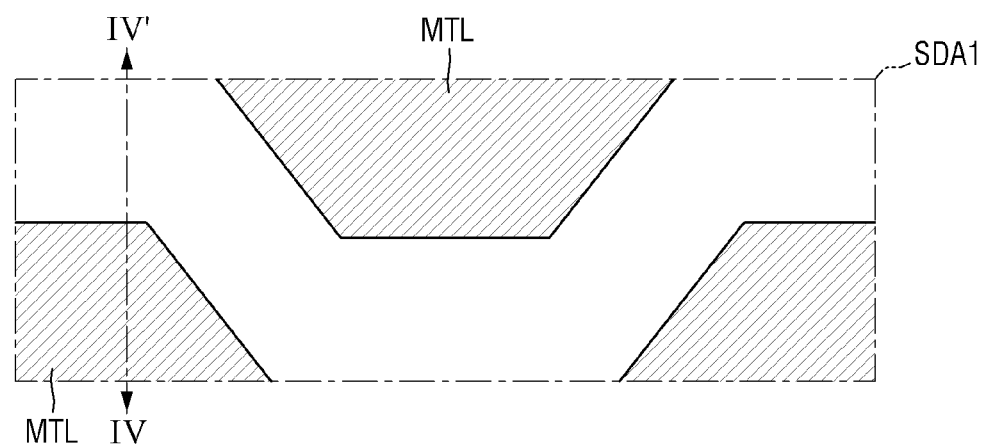
FIG. 23 is an enlarged schematic view of a portion SDA1 of FIG. 10.
Figure 24:
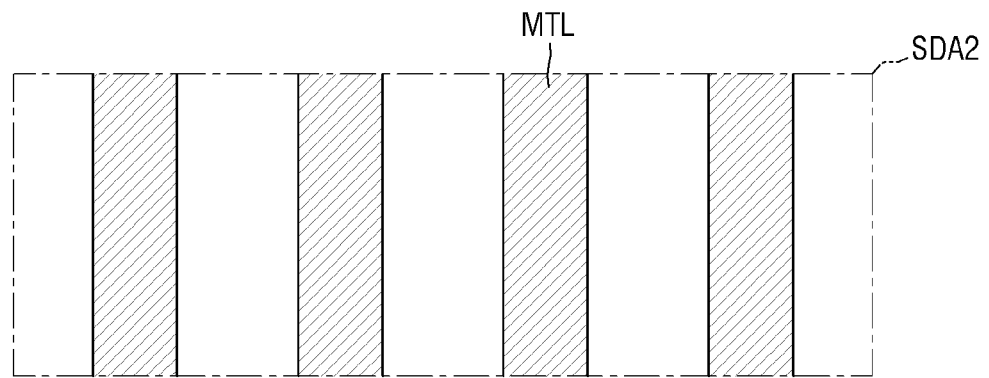
FIG. 24 is an enlarged schematic view of a portion SDA2 of FIG. 10.
Figure 25:
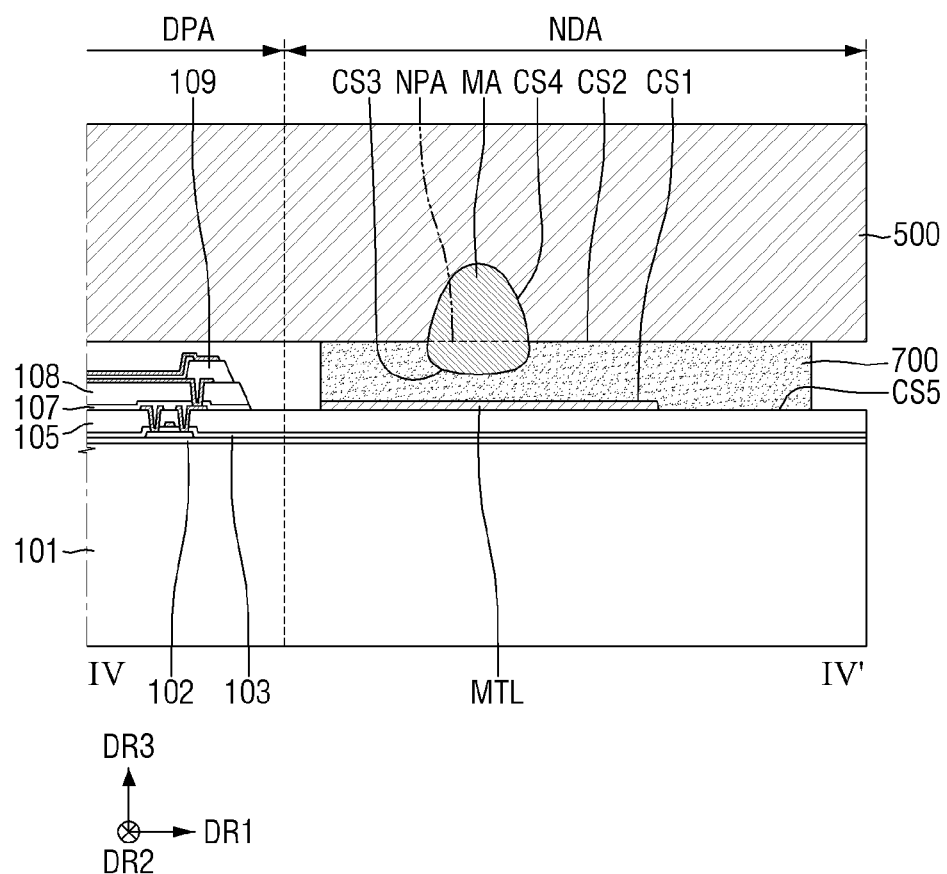
FIG. 25 is a cross-sectional view taken along line IV-IV' of FIG. 23.

FIG. 23 is an enlarged schematic view of a portion SDA1 of FIG. 10. FIG. 24 is an enlarged schematic view of a portion SDA2 of FIG. 10. FIG. 25 is a cross-sectional view taken along line Iv-IV of FIG. 23. In FIG. 10, the portion SDA1 may be a portion in which the first scan driver 110 or the second scan driver 120 is disposed in the non-display area NDA, and the portion SDA2 may be a portion in which the fan-out lines FL are disposed in the non-display area NDA.

Referring to FIGS. 23 to 25, the metal wiring layer MTL disposed in the non-display area NDA may form patterns partially spaced apart from each other, and the sealing member 700 may be in direct contact with a portion of the display panel 100 where the metal wiring layer MTL is not disposed. In an embodiment, the display panel 100 may include at least one insulating layer 102, 103 or 105 disposed under the metal wiring layer MTL or between the metal wiring layer MTL and the base substrate 101, and a portion of the upper surface of the insulating layer 102, 103 or 105 disposed in the non-display area NDA may be exposed. The metal wiring layer MTL is not necessarily disposed over the entire surface of the non-display area NDA, and may include patterns partially spaced apart from each other. A portion of the upper surface of the insulating layer 102, 103 or 105 disposed in the non-display area NDA may be exposed in a region where the patterns of the metal wiring layer MTL are spaced apart. Although it is illustrated in the drawing that, for simplicity of description, the metal wiring layer MTL has patterns extending in one direction and spaced apart from each other in the other direction, or patterns having an inclined side surface, the invention is not limited thereto. When the metal wiring layer MTL disposed on the display panel 100 of the display device 10 has patterns partially spaced apart from each other, the shape thereof is not particularly limited.

In an embodiment, the sealing member 700 disposed in the non-display area NDA may be disposed on the metal wiring layer MTL and the exposed insulating layer 102, 103 or 105, and at least a portion of the lower surface of the sealing member 700 may be in direct contact with the metal wiring layer MTL and the exposed insulating layer 102, 103 or 105. The sealing member 700 may further include a fifth boundary surface CS5 provided with the exposed insulating layer 102, 103 or 105 of the display panel 100, in addition to the first boundary surface (CS1 in FIG. 9) provided with the metal wiring layer MTL. The fifth boundary surface CS5 may be a portion where a physical boundary exists similarly to the first boundary surface CS1, and the lower surface of the sealing member 700 may be in direct contact with a portion of the insulating layer 102, 103 or 105 disposed on the display panel 100 in addition to the metal wiring layer MTL.

As described above, the fusion region MA provided at the boundary between the sealing member 700 and the encapsulation substrate 500 may be separated from the metal wiring layer MTL while overlapping the metal wiring layer MTL in the thickness direction. Although not illustrated, the non-display area NDA may include a portion in which the metal wiring layer MTL is not disposed and the insulating layer 102, 103 or 105 is exposed, and the fusion region MA may overlap the exposed insulating layer 102, 103 or 105. That is, in some embodiments, the fusion region MA may be provided between the sealing member 700 and the encapsulation substrate 500 so as not to overlap the metal wiring layer MTL in the thickness direction. Even when the second laser is irradiated, the metal wiring layer MTL may be prevented from being damaged.

In addition, since the display panel 100 includes a region in which the metal wiring layer MTL is not disposed in the non-display area NDA, the fusion region MA may be further disposed at a boundary between the sealing member 700 and the display panel 100.

Figure 26:
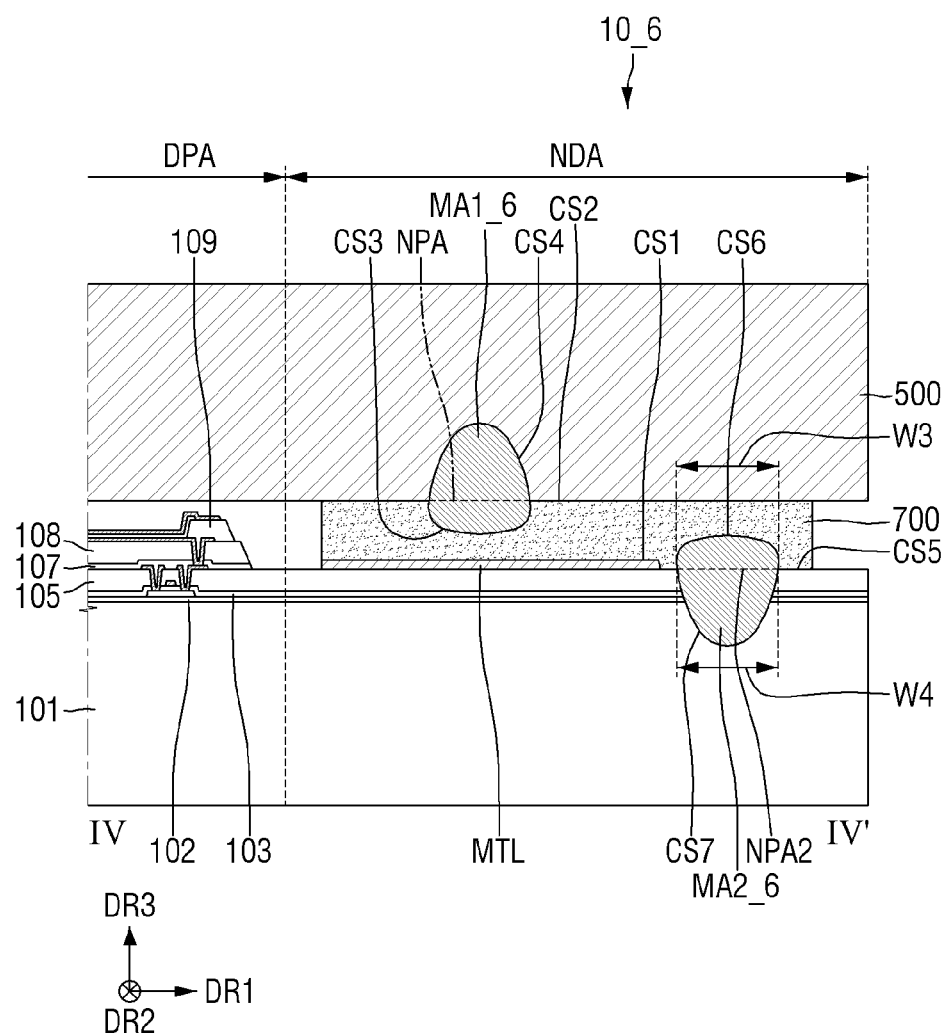
FIG. 26 is a cross-sectional view illustrating another embodiment of a portion of a display device.
Figure 27:
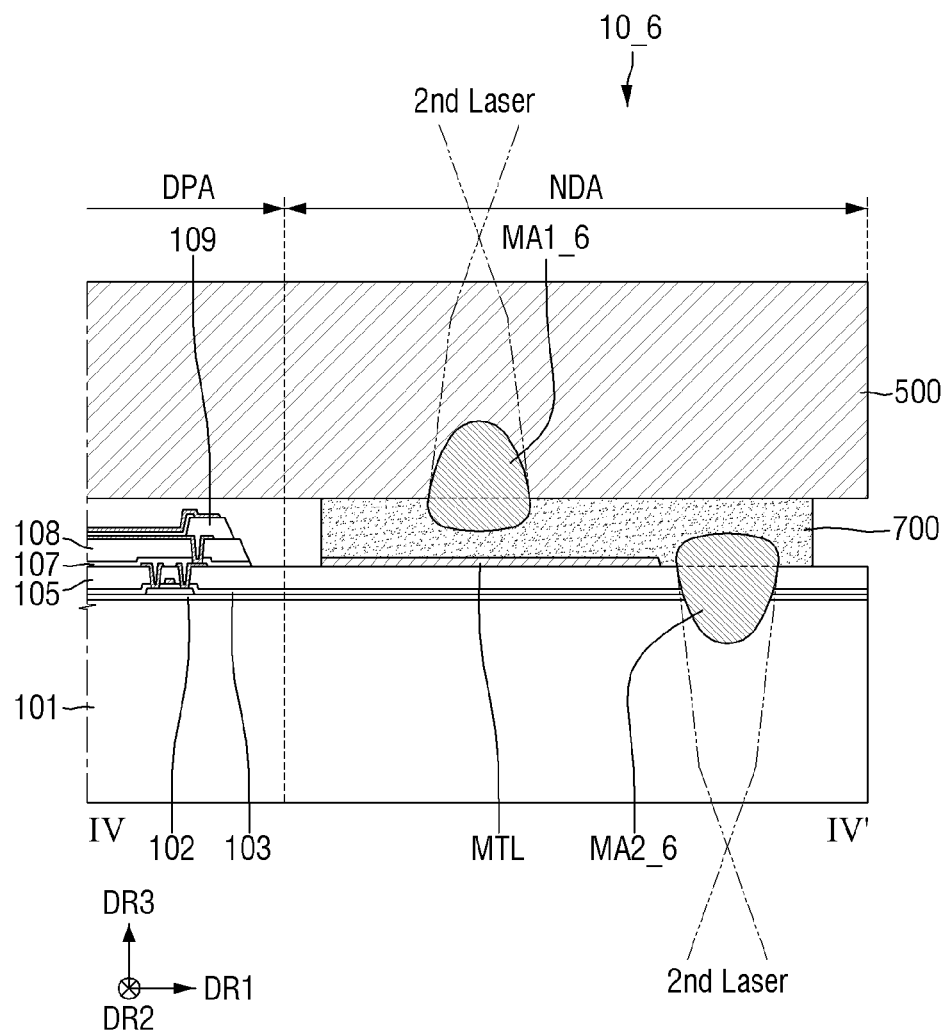
FIG. 27 is a cross-sectional view partially illustrating a process of fabricating the display device of FIG. 26.

FIG. 26 is a cross-sectional view illustrating a portion of a display device in another embodiment. FIG. 27 is a cross-sectional view partially illustrating a process of fabricating the display device of FIG. 26.

Referring to FIGS. 26 and 27, a display device 10_6 may further include a second fusion region MA2_6 provided between the sealing member 700 and the display panel 100 in addition to a first fusion region MA1_6 provided between the sealing member 700 and the encapsulation substrate 500. The non-display area NDA of the display panel 100 may include a portion where the metal wiring layer MTL is not disposed and the insulating layer 102, 103 or 105 is exposed, and the second fusion region MA2_6 may be provided in the exposed portion of the insulating layer 102, 103 or 105. Since a description of the first fusion region MA1_6 is the same as described above, the second fusion region MA2_6 will be described in detail below.

The second fusion region MA2_6 may be provided at a portion of the non-display area NDA of the display panel 100 where the metal wiring layer MTL is not disposed and the insulating layer 102, 103 or 105 is exposed. The second fusion region MA2_6 may be provided over the sealing member 700, the insulating layer 102, 103 or 105 of the display panel 100, and the base substrate 101. The sealing member 700 may form a fifth boundary surface CS5, where a physical boundary exists, with a portion where the insulating layer 102, 103 or 105 is exposed. The second fusion region MA2_6 may be a region where no physical boundary exists between the sealing member 700 and the display panel 100, and a physical boundary may not exist in a portion (NPA2 in FIG. 26) where the second fusion region MA2_6 is disposed on the extension line of the fifth boundary surface CS5.

The fifth boundary surface CS5 may be provided between the sealing member 700 and the exposed insulating layer 102, 103 or 105 of the display panel 100. A sixth boundary surface CS6 may be provided between the sealing member 700 and the second fusion region MA2_6. A seventh boundary surface CS7 may be provided between the second fusion region MA2_6 and the base substrate 101 of the display panel 100. The fifth boundary surface CS5 may have a physical boundary. However, similarly to the third boundary surface CS3 and the fourth boundary surface CS4, the sixth boundary surface CS6 and the seventh boundary surface CS7 may be boundaries where there are component differences according to positions, rather than physical boundaries. The second fusion region MA2_6 may be a region in which components constituting the sealing member 700 and components constituting the insulating layer 102, 103 or 105 of the display panel 100 or the base substrate 101 are mixed. A detailed description thereof is substantially the same as described above with respect to the first fusion region MA1_6.

In some embodiments, the second fusion region MA2_6 may include a third portion (e.g., upper portion of the second fusion region MA2_6 in FIGS. 26 and 27) overlapping the sealing member 700 and a fourth portion (e.g., lower portion the second fusion region MA2_6 in FIGS. 26 and 27) overlapping the display panel 100, and the maximum value of the width W3 of the third portion may be greater than the maximum value of the width W4 of the fourth portion. As illustrated in FIG. 27, the second fusion region MA2_6 may be provided by a second laser irradiated from the lower surface of the base substrate 101 of the display panel 100. As described above, the second laser may be set such that its focal point is separated from the lower surface of the base substrate 101, and an area to which the second laser is irradiated may be widened from the upper surface of the base substrate 101 to the sealing member 700. In an embodiment, in the second fusion region MA2_6, the maximum value of the width W3 of the third portion may be greater than the maximum value of the width W4 of the fourth portion.

The display device 10_6 may further include the second fusion region MA2_6 provided between the display panel 100 and the sealing member 700 in addition to the first fusion region MA1_6 provided between the encapsulation substrate 500 and the sealing member 700. The sealing member 700 includes the first fusion region MA1_6 separated from the metal wiring layer MTL while overlapping the metal wiring layer MTL in the thickness direction and the second fusion region MA2_6 provided in a region where the metal wiring layer MTL is not disposed. Accordingly, the bonding force between the sealing member 700 and the display panel 100 and between the sealing member 700 the encapsulation substrate 500 may be further improved.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A method of fabricating a display device, the method comprising:
preparing a first substrate including a display area and a non-display area and a second substrate facing the first substrate;
bonding the first substrate to the second substrate via a sealing member; and
irradiating an intense light to the sealing member to form a fusion region having no physical boundary at the interface between the second substrate and the sealing member,
the sealing member including:
a first extension portion extending in a first direction along the non-display area;

a second extension portion extending in a second direction intersecting the first direction; and a first corner portion connected to the first extension portion and the second extension portion, the first corner portion having a curvature; and the fusion region provided between the second substrate and the sealing member, wherein the fusion region is provided at least in the first corner portion of the sealing member, wherein the fusion region is also disposed in the first extension portion and the second extension portion of the sealing member, and wherein a plurality of fusion regions is spaced apart from each other in the first direction and the second direction.

2. The method of claim 1, wherein a focal point of the intense light is set to be separated from an upper surface of the second substrate, and a separation distance between the focal point of the intense light and the upper surface of the second substrate ranges from about 0.1 micrometers to about 200 micrometers.

3. The method of claim 2, wherein the intense light is irradiated at a frequency of about 1 kilohertz to 10 megahertz for about 10 femtoseconds to about 50 picoseconds.

4. The method of claim 2, wherein the fusion region is disposed over the sealing member and the second substrate and separated from the first substrate.

5. The method of claim 4, wherein the bonding the first substrate to the second substrate comprises filling frit crystals between the first substrate and the second substrate, and sintering and melting the frit crystals to form the sealing member.

6. A method of fabricating a display device, the method comprising:

preparing a first substrate including a display area and a non-display area and a second substrate facing the first substrate;

bonding the first substrate to the second substrate via a sealing member; and irradiating an intense light to the sealing member to form a fusion region having no physical boundary at the interface between the second substrate and the sealing member, wherein the fusion region includes a first portion positioned in parallel with the sealing member and a second portion positioned in parallel with the second substrate in a cross-sectional view, and wherein a maximum value of a width of the first portion is greater than a maximum value of a width of the second portion in the cross-sectional view, wherein the first portion and the second portion overlap each other in a direction perpendicular to a surface of the second substrate facing a surface of the first substrate.

7. The method of claim 6, wherein a focal point of the intense light is set to be separated from an upper surface of the second substrate, and a separation distance between the focal point of the intense light and the upper surface of the second substrate ranges from about 0.1 micrometers to about 200 micrometers.

8. The method of claim 7, wherein the intense light is irradiated at a frequency of about 1 kilohertz to 10 megahertz for about 10 femtoseconds to about 50 picoseconds.

9. The method of claim 7, wherein the fusion region is disposed over the sealing member and the second substrate and separated from the first substrate.

10. The method of claim 9, wherein the bonding the first substrate to the second substrate comprises filling frit crystals between the first substrate and the second substrate, and sintering and melting the frit crystals to form the sealing member.

11. The method of claim 6, wherein the first fusion region is provided by mixing a material of the sealing member with a material of the second substrate.

12. The method of claim 6, wherein a height of the first fusion region is greater than a thickness of the sealing member.

13. The method of claim 6, wherein the first fusion region includes a third boundary surface between the first portion and the sealing member and a fourth boundary surface between the second portion and the second substrate.

14. The method of claim 6, wherein a thickness of the sealing member ranges from about 4.5 micrometers to about 6 micrometers, and a height of the first portion ranges from about 2 micrometers to about 4 micrometers.

* * * * *